US011908850B2

(12) United States Patent
Yamazaki et al.

(10) Patent No.: US 11,908,850 B2
(45) Date of Patent: Feb. 20, 2024

(54) DISPLAY DEVICE, DISPLAY MODULE, ELECTRONIC DEVICE, AND METHOD FOR MANUFACTURING DISPLAY DEVICE

(71) Applicant: SEMICONDUCTOR ENERGY LABORATORY CO., LTD., Atsugi (JP)

(72) Inventors: Shunpei Yamazaki, Tokyo (JP); Koji Kusunoki, Kanagawa (JP); Shingo Eguchi, Kanagawa (JP); Takayuki Ikeda, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 17/270,081

(22) PCT Filed: Aug. 22, 2019

(86) PCT No.: PCT/IB2019/057065
§ 371 (c)(1),
(2) Date: Feb. 22, 2021

(87) PCT Pub. No.: WO2020/049392
PCT Pub. Date: Mar. 12, 2020

(65) Prior Publication Data

US 2021/0327865 A1 Oct. 21, 2021

(30) Foreign Application Priority Data

Sep. 5, 2018 (JP) ................................ 2018-166335
Sep. 5, 2018 (JP) ................................ 2018-166336

(51) Int. Cl.
*H01L 25/16* (2023.01)
*H01L 27/12* (2006.01)
(Continued)

(52) U.S. Cl.
CPC .............. *H01L 25/18* (2013.01); *G06F 3/044* (2013.01); *H01L 24/94* (2013.01);
(Continued)

(58) Field of Classification Search
CPC ............. H01L 27/3262; H01L 27/3246; H01L 27/3258; H01L 27/3248; H01L 27/323
See application file for complete search history.

(56) References Cited

U.S. PATENT DOCUMENTS 6,501,227 B1 * 12/2002 Koyama ................. G09G 3/30
315/169.3
7,358,935 B2 4/2008 Yamashita et al.
(Continued)

FOREIGN PATENT DOCUMENTS

CN 104011864 A 8/2014
CN 104952899 A 9/2015
(Continued)

OTHER PUBLICATIONS

International Search Report (Application No. PCT/IB2019/057065) dated Dec. 3, 2019.
(Continued)

*Primary Examiner* — Anthony Ho
*Assistant Examiner* — David J Goodwin
(74) *Attorney, Agent, or Firm* — NIXON PEABODY LLP; Jeffrey L. Costellia

(57) ABSTRACT

A display device with high resolution is provided. A display device with high display quality is provided. The display device includes a substrate, an insulating layer, a plurality of transistors, and a plurality of light-emitting diodes. The plurality of light-emitting diodes are provided in a matrix over the substrate. Each of the plurality of transistors is electrically connected to at least one of the plurality of light-emitting diodes. The plurality of light-emitting diodes
(Continued)

are positioned closer to the substrate than the plurality of transistors are. The plurality of light-emitting diodes emit light toward the substrate. Each of the plurality of transistors includes a metal oxide layer and a gate electrode. The metal oxide layer includes a channel formation region. The top surface of the gate electrode is substantially level with the top surface of the insulating layer.

18 Claims, 15 Drawing Sheets

(51) Int. Cl.

| | |
|---|---|
| ***H01L 33/52*** | (2010.01) |
| ***H01L 25/18*** | (2023.01) |
| ***H01L 33/00*** | (2010.01) |
| ***G06F 3/044*** | (2006.01) |
| ***H01L 23/00*** | (2006.01) |
| ***H01L 25/065*** | (2023.01) |
| ***H01L 25/00*** | (2006.01) |
| *H01L 27/15* | (2006.01) |

(52) U.S. Cl.

CPC ........ *H01L 25/0657* (2013.01); *H01L 25/167* (2013.01); *H01L 25/50* (2013.01); *H01L 33/0093* (2020.05); *G06F 2203/04103* (2013.01); *H01L 24/16* (2013.01); *H01L 27/1225* (2013.01); *H01L 27/156* (2013.01); *H01L 2224/16145* (2013.01); *H01L 2225/06513* (2013.01); *H01L 2924/12041* (2013.01)

(56) References Cited

U.S. PATENT DOCUMENTS

| | | | | |
|---|---|---|---|---|
| 8,791,474 | B1 | 7/2014 | Bibl et al. | |
| 9,105,813 | B1 | 8/2015 | Chang | |
| 9,153,171 | B2 | 10/2015 | Sakariya et al. | |
| 9,219,197 | B1 | 12/2015 | Chen et al. | |
| 9,231,153 | B2 | 1/2016 | Chen et al. | |
| 9,252,375 | B2 | 2/2016 | Bibl et al. | |
| 9,280,931 | B2 | 3/2016 | Kimura | |
| 9,362,335 | B2 | 6/2016 | von Malm | |
| 9,406,898 | B2 | 8/2016 | Yamazaki et al. | |
| 9,590,137 | B2 | 3/2017 | Chen et al. | |
| 9,748,309 | B2 | 8/2017 | von Malm | |
| 9,831,275 | B2 | 11/2017 | Koezuka et al. | |
| 9,848,070 | B2 | 12/2017 | Yamazaki et al. | |
| 9,865,832 | B2 | 1/2018 | Bibl et al. | |
| 9,954,112 | B2 | 4/2018 | Asami. et al. | |
| 10,008,645 | B2 | 6/2018 | Bonar et al. | |
| 10,056,413 | B2 | 8/2018 | Kimura | |
| 10,062,675 | B2 | 8/2018 | Chang et al. | |
| 10,158,043 | B2 | 12/2018 | Chen et al. | |
| 10,367,122 | B2 | 7/2019 | Bonar et al. | |
| 10,411,210 | B2 | 9/2019 | Bibl et al. | |
| 10,431,600 | B2 | 10/2019 | Koezuka et al. | |
| 10,461,120 | B2 | 10/2019 | von Malm | |
| 10,559,249 | B2 | 2/2020 | Yoneda | |
| 10,607,973 | B2 | 3/2020 | Chang et al. | |
| 10,615,189 | B2 | 4/2020 | Kimura | |
| 10,784,241 | B2 | 9/2020 | Chang et al. | |
| 10,862,010 | B2 | 12/2020 | Bonar et al. | |
| 10,868,045 | B2 | 12/2020 | Yamazaki | |
| 10,902,770 | B2 | 1/2021 | Iguchi et al. | |
| 10,924,595 | B2 | 2/2021 | Yamazaki et al. | |
| 10,964,900 | B2 | 3/2021 | Bibl et al. | |
| 11,380,862 | B2 | 7/2022 | Bibi et al. | |
| 2005/0093434 | A1* | 5/2005 | Suh | H01L 27/3244 313/504 |
| 2005/0156828 | A1 | 7/2005 | Yamashita et al. | |
| 2010/0102752 | A1 | 4/2010 | Chen et al. | |
| 2013/0092930 | A1 | 4/2013 | Kimura | |
| 2014/0168037 | A1 | 6/2014 | Sakariya et al. | |
| 2014/0292745 | A1 | 10/2014 | Kikuchi et al. | |
| 2014/0306260 | A1 | 10/2014 | Yamazaki et al. | |
| 2014/0367705 | A1 | 12/2014 | Bibl et al. | |
| 2015/0014716 | A1 | 1/2015 | Von Malm | |
| 2015/0187898 | A1* | 7/2015 | Miyairi | H01L 27/1225 257/762 |
| 2015/0339979 | A1 | 11/2015 | Kikuchi et al. | |
| 2015/0349200 | A1 | 12/2015 | Chen et al. | |
| 2015/0349285 | A1 | 12/2015 | Seo et al. | |
| 2016/0013170 | A1 | 1/2016 | Sakariya et al. | |
| 2016/0218219 | A1 | 7/2016 | Asami. et al. | |
| 2016/0268513 | A1 | 9/2016 | Ishisone et al. | |
| 2016/0372514 | A1 | 12/2016 | Chang et al. | |
| 2017/0062749 | A1 | 3/2017 | Seo et al. | |
| 2017/0090246 | A1 | 3/2017 | Seo et al. | |
| 2017/0133550 | A1 | 5/2017 | Schuele et al. | |
| 2017/0170200 | A1 | 6/2017 | Ikeda et al. | |
| 2017/0186365 | A1 | 6/2017 | Yoneda | |
| 2018/0012949 | A1 | 1/2018 | Takeya et al. | |
| 2018/0019233 | A1 | 1/2018 | Chang et al. | |
| 2018/0076352 | A1 | 3/2018 | Heine et al. | |
| 2018/0083218 | A1 | 3/2018 | Choi et al. | |
| 2018/0122836 | A1 | 5/2018 | Kang et al. | |
| 2018/0166643 | A1 | 6/2018 | Kim et al. | |
| 2018/0248043 | A1 | 8/2018 | Asami et al. | |
| 2019/0095019 | A1* | 3/2019 | Shin | H01L 51/5012 |
| 2019/0124188 | A1 | 4/2019 | Yamazaki et al. | |
| 2019/0206849 | A1* | 7/2019 | Jang | H01L 33/405 |
| 2019/0214376 | A1* | 7/2019 | Kim | H01L 27/1259 |
| 2019/0237584 | A1 | 8/2019 | Asami. et al. | |
| 2019/0244937 | A1 | 8/2019 | Honjo et al. | |
| 2020/0006688 | A1 | 1/2020 | Seo et al. | |
| 2020/0027388 | A1 | 1/2020 | Iwaki. et al. | |
| 2020/0185429 | A1 | 6/2020 | Kimura | |
| 2020/0403028 | A1 | 12/2020 | Kusunoki et al. | |
| 2021/0118855 | A1 | 4/2021 | Kusunoki et al. | |
| 2021/0174734 | A1 | 6/2021 | Takahashi et al. | |
| 2021/0217805 | A1 | 7/2021 | Kusunoki et al. | |
| 2022/0293876 | A1 | 9/2022 | Bibl et al. | |

FOREIGN PATENT DOCUMENTS

| | | | |
|---|---|---|---|
| CN | 105144841 | A | 12/2015 |
| CN | 107210315 | A | 9/2017 |
| CN | 109479354 | A | 3/2019 |
| CN | 110100318 | A | 8/2019 |
| EP | 3487266 | A | 5/2019 |
| JP | 2013-137509 | A | 7/2013 |
| JP | 2013-145833 | A | 7/2013 |
| JP | 2014-202778 | A | 10/2014 |
| JP | 2015-501085 | | 1/2015 |
| JP | 2015-109252 | A | 6/2015 |
| JP | 2016-512347 | | 4/2016 |
| JP | 2016-174143 | A | 9/2016 |
| JP | 6131374 | | 5/2017 |
| JP | 2017-120412 | A | 7/2017 |
| JP | 2017-130647 | A | 7/2017 |
| JP | 2017-538290 | | 12/2017 |
| JP | 2018-078279 | A | 5/2018 |
| KR | 2014-0092345 | A | 7/2014 |
| KR | 2014-0116382 | A | 10/2014 |
| KR | 2015-0143638 | A | 12/2015 |
| KR | 2017-0084139 | A | 7/2017 |
| KR | 2017-0104086 | A | 9/2017 |
| KR | 2017-0106358 | A | 9/2017 |
| TW | 201324486 | | 6/2013 |
| TW | 201504056 | | 2/2015 |
| TW | 201639148 | | 11/2016 |
| TW | 201639175 | | 11/2016 |
| TW | 201701458 | | 1/2017 |
| TW | 201804608 | | 2/2018 |
| WO | WO-2008/006756 | | 1/2008 |
| WO | WO-2013/058199 | | 4/2013 |
| WO | WO-2014/149864 | | 9/2014 |
| WO | WO-2014/171336 | | 10/2014 |
| WO | WO-2016/079505 | | 5/2016 |
| WO | WO-2016/120741 | | 8/2016 |

(56) References Cited

FOREIGN PATENT DOCUMENTS

| | | |
|---|---|---|
| WO | WO-2016/125051 | 8/2016 |
| WO | WO-2016/203340 | 12/2016 |
| WO | WO-2018/016728 | 1/2018 |
| WO | WO-2018/116814 | 6/2018 |

OTHER PUBLICATIONS

Written Opinion (Application No. PCT/IB2019/057065) dated Dec. 3, 2019.
Chinese Office Action (Application No. 201980057735.9) dated Aug. 2, 2022.
Taiwanese Office Action (Application No. 108130547) dated Nov. 8, 2022.

* cited by examiner

DISPLAY DEVICE, DISPLAY MODULE, ELECTRONIC DEVICE, AND METHOD FOR MANUFACTURING DISPLAY DEVICE

TECHNICAL FIELD

One embodiment of the present invention relates to a display device, a display module, an electronic device, and a manufacturing method thereof.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input/output device (e.g., a touch panel), a driving method thereof, and a manufacturing method thereof.

BACKGROUND ART

In recent years, a display device using a micro light-emitting diode (a micro LED) as a display element has been proposed (e.g., Patent Document 1). The display device using a micro LED as a display element has advantages of high luminance, high contrast, a long lifetime, and the like, and has been actively developed as a next-generation display device.

REFERENCE

Patent Document

[Patent Document 1] Specification of United States Patent Application Publication No. 201410367705

SUMMARY OF THE INVENTION

Problems to be Solved by the Invention

It takes an extremely long e to mount LED chips on a display device using a micro LED as a display element; hence, manufacturing cost reduction is needed. In a pick-and-place method, for example, red (R), green (G), and blue (B) LEDs are fabricated on respective wafers, and the LEDs are cut out one by one and mounted on a circuit board. Consequently, as the number of pixels in a display device increases, the number of LEDs to be mounted increases, and thus the time taken for mounting becomes longer. Moreover, as the resolution of a display device becomes higher, the degree of difficulty in mounting LEDs increases.

An object of one embodiment of the present invention is to provide a display device with high resolution. An object of one embodiment of the present invention is to provide a display device with high display quality. An object of one embodiment of the present invention is to provide a display device with low power consumption. An object of one embodiment of the present invention is to provide a highly reliable display device.

An object of one embodiment of the present invention is to reduce manufacturing cost of a display device using a micro LED as a display element. An object of one embodiment of the present invention is to manufacture a display device using a micro LED as a display element with a high yield.

Note that the description of these objects does not preclude the existence of other objects. One embodiment of the present invention does not need to achieve all these objects. Other objects can be derived from the description of the specification, the drawings, and the claims.

Means for Solving the Problems

A display device of one embodiment of the present invention includes a substrate, an insulating layer, a plurality of transistors, and a plurality of light-emitting diodes. The plurality of light-emitting diodes are provided in a matrix over the substrate. Each of the plurality of transistors is electrically connected to at least one of the plurality of light-emitting diodes. The plurality of light-emitting diodes are positioned closer to the substrate than the plurality of transistors are. The plurality of light-emitting diodes emit light toward the substrate. Each of the plurality of transistors includes a metal oxide layer and a gate electrode. The metal oxide layer includes a channel formation region. A top surface of the gate electrode is substantially level with a top surface of the insulating layer.

Alternatively, the display device of one embodiment of the present invention includes a substrate, an insulating layer, a plurality of transistors, and a plurality of light-emitting diodes. The plurality of light-emitting diodes are provided in a matrix over the substrate. Each of the plurality of transistors is electrically connected to at least one of the plurality of light-emitting diodes. The plurality of light-emitting diodes are positioned closer to the substrate than the plurality of transistors are. The plurality of light-emitting diodes emit light toward the substrate. Each of the plurality of transistors includes a metal oxide layer, a gate insulating layer, a gate electrode, a first conductive layer, and a second conductive layer. The metal oxide layer includes a channel formation region. The metal oxide layer includes a first region overlapping with the first conductive layer, a second region overlapping with the second conductive layer, and a third region between the first region and the second region. The first conductive layer and the second conductive layer are apart from each other over the metal oxide layer. The insulating layer is positioned over the first conductive layer and the second conductive layer. The insulating layer includes an opening overlapping with the third region. The gate insulating layer is positioned inside the opening and overlaps with a side surface of the insulating layer and a top surface of the third region. The gate electrode is positioned inside the opening and overlaps with the side surface of the insulating layer and the top surface of the third region with the gate insulating layer therebetween.

At least one of the plurality of light-emitting diodes is preferably a micro light-emitting diode.

The plurality of light-emitting diodes may include a first light-emitting diode and a second light-emitting diode that emit light of different colors. In that case, a first transistor electrically connected to the first light-emitting diode and a second transistor electrically connected to the second light-emitting diode may differ in one or both of a channel length and a channel width.

Alternatively, all the plurality of light-emitting diodes may light of an identical color.

The display device of one embodiment of the present invention preferably further includes a driver circuit. The driver circuit includes a plurality of circuit transistors. Each of the plurality of circuit transistors includes a channel formation region in a semiconductor substrate. The insulating layer, the plurality of transistors, and the plurality of light-emitting diodes are positioned between the substrate and the semiconductor substrate. The plurality of transistors are positioned closer to the substrate than the plurality of circuit transistors are.

The display device of one embodiment of the present invention preferably further includes a functional layer. The functional layer is positioned between the substrate and at least one of the plurality of light-emitting diodes. At least one of the plurality of light-emitting diodes emits light toward the substrate through the functional layer. The functional layer includes one or both of a coloring layer and a color conversion layer.

The display device of one embodiment of the present invention preferably further includes a touch sensor. The light-emitting diode emits light toward the touch sensor through the substrate.

One embodiment of the present invention is a module including the display device having the above-described structure, where a connector such as a flexible printed circuit (hereinafter referred to as FPC) or a TCP (Tape Carrier Package) is attached or an integrated circuit (IC) is mounted by a COG (Chip On Glass) method, a COP (Chip On Film) method, or the like.

One embodiment of the present invention is an electronic device including the above-described module and at least one of an antenna, a battery, a housing, a camera, a speaker, a microphone, and an operation button One embodiment of the present invention is a method for manufacturing a display device, including forming a plurality of transistors in a matrix over a first substrate; forming a plurality of light-emitting diodes in a matrix over a second substrate; forming, over the first substrate or the second substrate, a first conductor electrically connected to at least one of the plurality of transistors or at least one of the plurality of light-emitting diodes; and attaching the first substrate and the second substrate to each other so that at least one of the plurality of transistors is electrically connected to at least one of the plurality of light-emitting diodes through the first conductor. At least one planarization treatment is used in the step of forming the plurality of transistors. At least one of the plurality of light-emitting diodes is preferably a micro light-emitting diode. At least one of the plurality of transistors preferably includes a metal oxide in a channel formation region.

In the method for manufacturing a display device of one embodiment of the present invention, the first conductor may be formed over the first substrate to electrically connect the first conductor to at least one of the plurality of transistors; a second conductor electrically connected to at least one of the plurality of light-emitting diodes may be formed over the second substrate; and the first substrate and the second substrate may be attached to each other so that the first conductor and the second conductor are in contact with each other.

In the method for manufacturing a display device of one embodiment of the present invention, at least one of a coloring layer, a color conversion layer, and a touch sensor may be formed over a third substrate; the first substrate and the second substrate may be attached to each other and then, the second substrate may be separated; and the third substrate may be attached to a surface exposed by separating the second substrate.

Alternatively, in the method for manufacturing a display device of one embodiment of the present invention, at least one of a coloring layer, a color conversion layer, and a touch sensor may be formed over a third substrate; the first substrate and the second substrate may be attached to each other and then, the second substrate may be polished to reduce the thickness of the second substrate; and the third substrate may be attached to a polished surface of the second substrate.

Effect of the Invention

According to one embodiment of the present invention, a display device with high resolution can be provided. According to one embodiment of the present invention, a display device with high display quality can be provided. According to one embodiment of the present invention, a display device with low power consumption can be provided. According to one embodiment of the present invention, a highly reliable display device can be provided.

According to one embodiment of the present invention, manufacturing cost of a display device using a micro LED as a display element can be reduced. According to one embodiment of the present invention, a display device using a micro LED as a display element can be manufactured with a high yield.

Note that the description of these effects does not preclude the existence of other effects. One embodiment of the present invention does not need to have all these effects. Other effects can be derived from the description of the specification, the drawings, and the claims.

MODE FOR CARRYING OUT THE INVENTION

Figure 1:
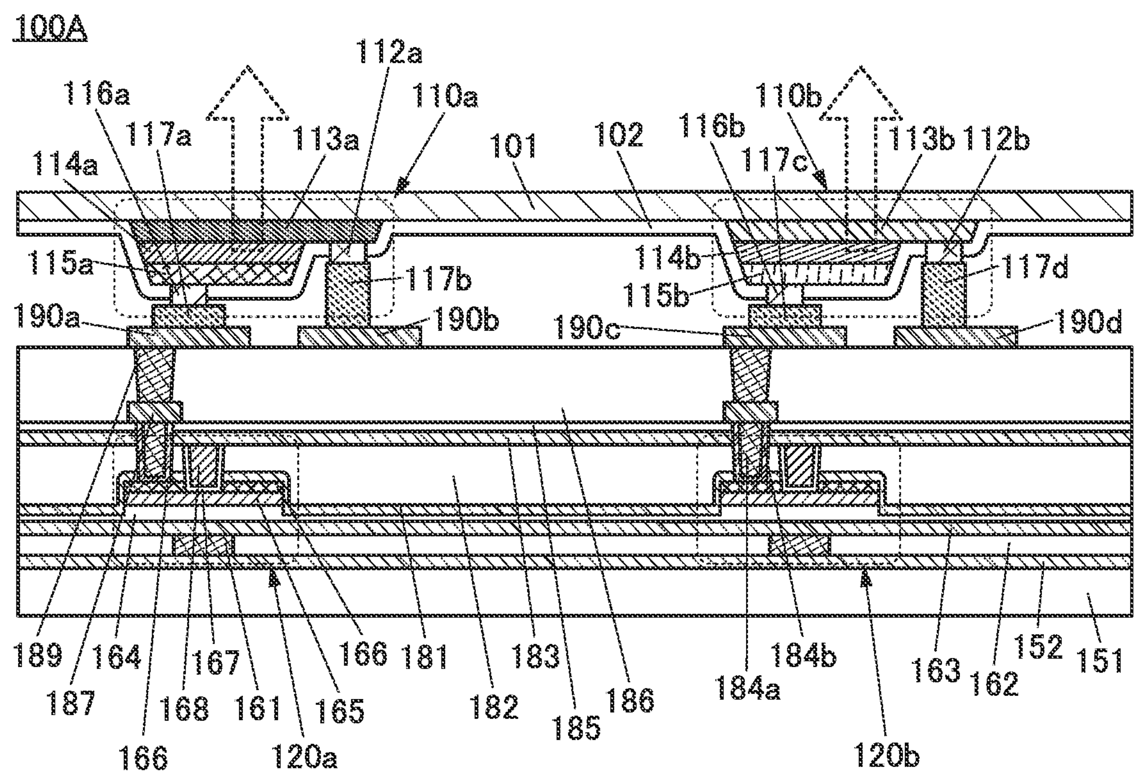
FIG. 1 is a cross-sectional view illustrating an example of a display device.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

In this embodiment, a display device of one embodiment of the present invention will be described with reference to FIG. 1 to FIG. 9.

[Overview of Display Device]

A display device of this embodiment includes a plurality of light-emitting diodes that are display elements and a plurality of transistors for driving the display elements. The plurality of light-emitting diodes are provided in a matrix over a substrate having a property of transmitting visible light. Each of the plurality of transistors is electrically connected to at least one of the plurality of light-emitting diodes. The plurality of light-emitting diodes are positioned closer to the substrate than the plurality of transistors are. The plurality of light-emitting diodes emit light toward the substrate.

The display device of this embodiment is formed by attaching the plurality of transistors and the plurality of light-emitting diodes to each other, which are formed over different substrates.

In a method for manufacturing the display device of this embodiment, the plurality of light-emitting diodes and the plurality of transistors are attached to each other at a time; thus, even in the case of manufacturing a display device having a large number of pixels or a display device with high resolution, the manufacturing time for the display device can be shortened and manufacturing difficulty can be lowered, compared to a method in which light-emitting diodes are mounted on a circuit board one by one.

The display device of this embodiment has a function of displaying an image with the use of the light-emitting diode. In the case where a light-emitting diode, which is a self-luminous element, is used as a display element, a backlight is unnecessary and a polarizing plate is not necessarily provided in the display device. Consequently, the display device can have reduced power consumption and can be thin and lightweight. Moreover, the display device using the light-emitting diode as the display element has high contrast and a wide viewing angle and thus can have high display quality. With the use of an inorganic material as a light-emitting material, the display device can have a long lifetime and improved reliability.

In this embodiment, an example where a micro LED is used as the light-emitting diode is specifically described. In this embodiment, a micro LED having a double heterojunction is described. Note that there is no particular limitation on the light-emitting diode, and for example, a micro LED having a quantum well junction or a nanocolumn LED may be used.

The area of a light-emitting region of the light-emit ting diode is preferably less than or equal to 1 $mm^2$, further preferably less than or equal to 10000 $\mu m^2$, still further preferably less than or equal to 3000 $\mu m^2$, even further preferably less than or equal to 700 $\mu m^2$. Note that in this specification and the like, a light-emitting diode in which the area of a light-emitting region is less than or equal to 10000 $\mu m^2$ is referred to as a micro LED in some cases.

The transistor included in the display device preferably includes a metal oxide in its channel formation region. The transistor using a metal oxide can have low power consumption. Thus, a combination with a micro LED can achieve a display device with significantly reduced power consumption.

In particular, the display device of this embodiment preferably includes a transistor in which the top surface of a gate electrode and the top surface of an insulating layer are substantially level with each other. By planarization treatment employing a CMP (Chemical Mechanical Polishing) method or the like, for example, the top surface of the gate electrode and the top surface of the insulating layer are planarized, whereby the top surface of the gate electrode and the top surface of the insulating layer can be level with each other.

A transistor with such a structure can be easily reduced in size. When the size of the transistor is reduced, the size of a pixel can be reduced, so that the resolution of the display device can be increased.

The display device of this embodiment can have high resolution and thus can be suitably used in an electronic device having a relatively small display portion. Examples of such an electronic device include watch-type and bracelet-type information terminal devices (wearable devices) and wearable devices capable of being worn on the head, such as a VR (Virtual Reality) device such as a head-mounted display, a glasses-type AR (Augmented Reality) device, and an MR (Mixed Reality) device.

[Structure Example 1 of Display Device]

FIG. 1 is a cross-sectional view of a display device 100A. FIG. 2 shows cross-sectional views illustrating a method for manufacturing the display device 100A.

Figure 2A:
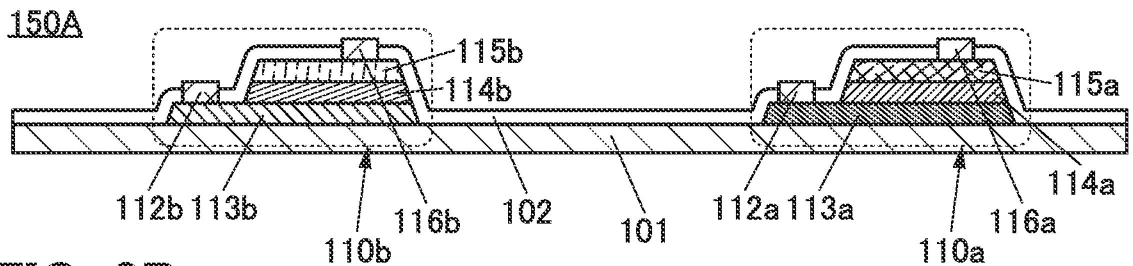
FIG. 2(A) to FIG. 2(C) are cross-sectional views illustrating an example of a method for manufacturing a display device.
Figure 2B:
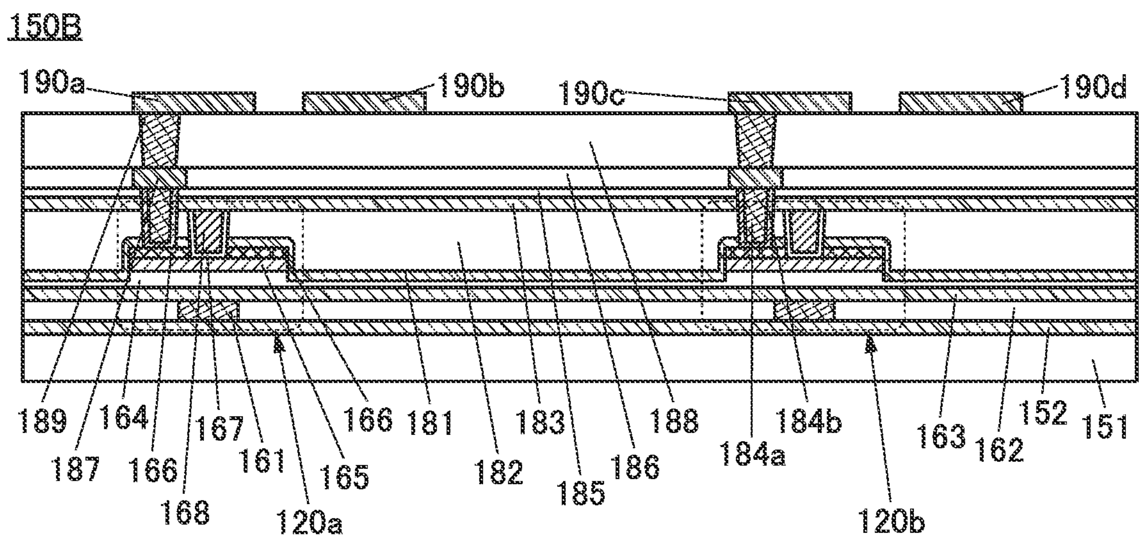
Figure 2C:
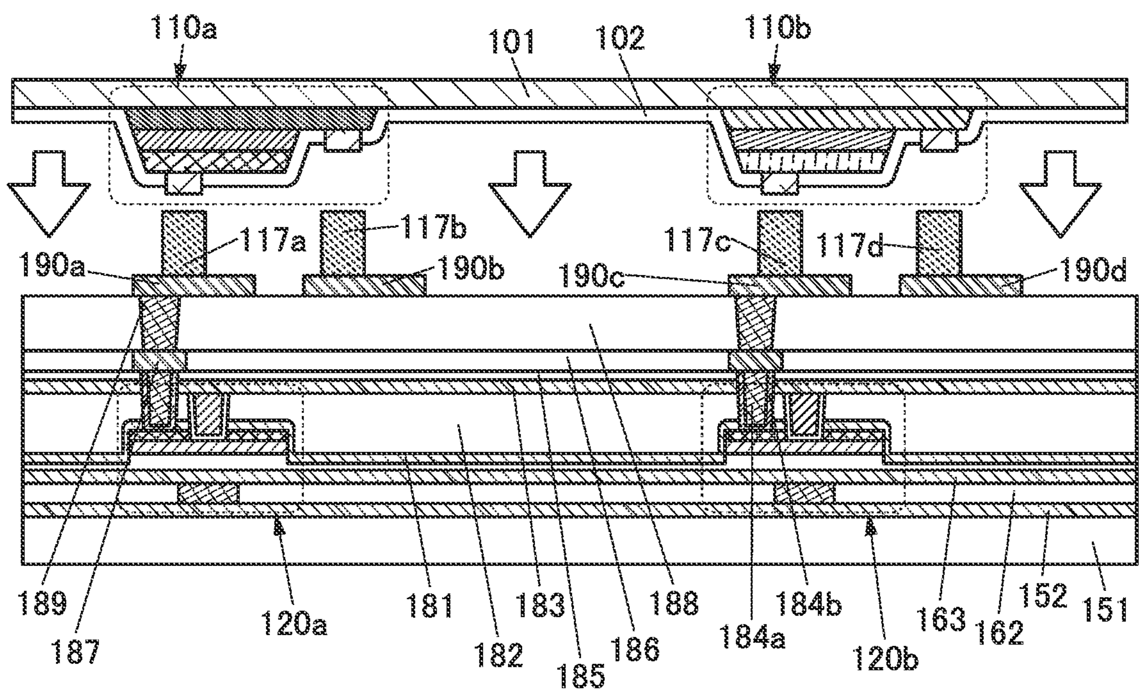

The display device 100A illustrated in FIG. 1 is formed by attaching an LED substrate 150A illustrated in FIG. 2(A) and a circuit board 150B illustrated in FIG. 2(B) to each other (see FIG. 2(C)).

FIG. 2(A) is a cross-sectional view of the LED substrate 150A.

The LED substrate 150A includes a substrate 101, a light-emitting diode 110*a*, a light-emitting diode 110*b*, and a protective layer 102.

The light-emitting diode 110*a* includes an electrode 112*a*, a semiconductor layer 113*a*, a light-emitting layer 114*a*, a semiconductor layer 115*a*, and an electrode 116*a*. The light-emitting diode 110*b* includes an electrode 112*b*, a semiconductor layer 113*b*, a light-emitting layer 114*b*, a semiconductor layer 115*b*, and an electrode 116*b*.

The electrode 112*a* is electrically connected to the semiconductor layer 113*a*. The electrode 116*a* is electrically connected to the semiconductor layer 115*a*. The electrode 112*b* is electrically connected to the semiconductor layer 113*b*. The electrode 116*b* is electrically connected to the semiconductor layer 115*b*. The protective layer 102 is provided to cover the substrate 101, the semiconductor layers 113*a* and 113*b*, the light-emitting layers 114*a* and 114*b*, and the semiconductor layers 115*a* and 115*b*. The protective layer 102 covers the side surfaces of the electrodes 112*a* and 112*b* and the side surfaces of the electrodes 116*a* and 116*b*, and has openings overlapping with the top surfaces of the electrodes 112*a* and 112*b* and the top surfaces of the electrodes 116*a* and 116*b*. In the openings, the top surfaces of the electrodes 112*a* and 112*b* and the top surfaces of the electrodes 116*a* and 116*b* are exposed.

The light-emitting layer 114*a* is positioned between the semiconductor layer 113*a* and the semiconductor layer 115*a*. The light-emitting layer 114*b* is positioned between the semiconductor layer 113*b* and the semiconductor layer 115*b*. In the light-emitting layers 114*a* and 114*b*, electrons and holes are combined to emit light. Either the semiconductor layers 113*a* and 113*b* or the semiconductor layers 115*a* and 115*b* are n-type semiconductor layers, and the others are p-type semiconductor layers.

A stacked-layer structure including the semiconductor layer 113*a*, the light-emitting layer 114*a*, and the semiconductor layer 115*a* and a stacked-layer structure including the semiconductor layer 113*b*, the light-emitting layer 114*b*, and the semiconductor layer 115*b* are each formed to emit light of red, yellow, green, blue, or the like. It is preferable that the two stacked-layer structures emit light of different colors. For these stacked-layer structures, a compound of gallium and phosphorus; a compound of gallium and arsenic; a compound of gallium, aluminum, and arsenic; a compound of aluminum, gallium, indium, and phosphorus; gallium nitride; a compound of indium and gallium nitride; a compound of selenium and zinc; or the like can be used, for example.

When the light-emitting diode 110*a* and the light-emitting diode 110*b* are formed to emit light of different colors, a step of forming a color conversion layer is not necessary. Consequently, the manufacturing cost of the display device can be reduced.

The two stacked-layer structures may emit light of the same color. In this case, light emitted from the light-emitting layers 114*a* and 114*b* may be extracted to the outside of the display device through one or both of a color conversion layer and a coloring layer. Note that the structure in which pixels of each color include light-emitting diodes emitting light of the same color will be described later in Structure example 2 of display device.

The display device of this embodiment may include a light-emitting diode emitting infrared light. The light-emitting diode emitting infrared light can be used as a light source for an infrared light sensor, for example.

As the substrate 101, a single crystal substrate such as a sapphire ($Al_2O_3$) substrate, a silicon carbide (SiC) substrate, a silicon (Si) substrate, or a gallium nitride (GaN) substrate can be used, for example.

As illustrated in FIG. 1, light from the light-emitting diodes 110*a* and 110*b* is emitted toward the substrate 101. For that reason, the substrate 101 preferably has a property of transmitting visible light. Reducing the thickness of the substrate 101 by polishing or the like, for example, can increase the visible light transmitting property of the substrate 101.

FIG. 2(B) is a cross-sectional view of the circuit board 150B.

The circuit board 1509 includes a substrate 151, an insulating layer 152, a transistor 120*a*, a transistor 120*b*, a conductive layer 184*a*, a conductive layer 184*b*, a conductive layer 187, a conductive layer 189, an insulating layer 186, an insulating layer 188, a conductive layer 190*a*, a conductive layer 190*b*, a conductive layer 190*c*, and a conductive layer 190*d*. The circuit board 150B also includes insulating layers such as an insulating layer 162, an insulating layer 181, an insulating layer 182, an insulating layer 183, and an insulating layer 185. One or more of these insulating layers are sometimes considered as components of a transistor, but are not included as components of a transistor in the description in this embodiment.

As the substrate 151, an insulating substrate such as a glass substrate, a quartz substrate, a sapphire substrate, or a ceramic substrate; a single crystal semiconductor substrate or a polycrystalline semiconductor substrate including silicon, silicon carbide, or the like as a material; a compound semiconductor substrate of silicon germanium or the like; or a semiconductor substrate such as an SOT substrate can be used.

The substrate 151 preferably blocks visible light (has a property of not transmitting visible light). When the substrate 151 blocks visible light, entry of light from the outside into the transistors 120*a* and 120*b* formed on the substrate 151 can be inhibited. Note that one embodiment of the present invention is not limited thereto, and the substrate 151 may have a property of transmitting visible light.

The insulating layer 152 is provided over the substrate 151. The insulating layer 152 functions as a barrier layer that prevents diffusion of impurities such as water and hydrogen from the substrate 151 into the transistors 120*a* and 120*b* and release of oxygen from a metal oxide layer 165 toward the insulating layer 152. As the insulating layer 152, a film in which hydrogen or oxygen is less likely to diffuse than in a silicon oxide film, such as an aluminum oxide film, a hafnium oxide film, or a silicon nitride film, can be used, for example.

The transistors 120*a* and 120*b* each include a conductive layer 161, an insulating layer 163, an insulating layer 164, the metal oxide layer 165, a pair of conductive layers 166, an insulating layer 167, a conductive layer 168, and the like.

The metal oxide layer 165 includes a channel formation region. The metal oxide layer 165 includes a first region overlapping with one of the pair of conductive layers 166, a second region overlapping with the other of the pair of conductive layers 166, and a third region between the first region and the second region.

The conductive layer 161 and the insulating layer 162 are provided over the insulating layer 152, and the insulating layer 163 and the insulating layer 164 are provided to cover the conductive layer 161 and the insulating layer 162. The metal oxide layer 165 is provided over the insulating layer 164. The conductive layer 161 functions as a gate electrode, and the insulating layer 163 and the insulating layer 164 function as a gate insulating layer. The conductive layer 161 overlaps with the metal oxide layer 165 with the insulating layer 163 and the insulating layer 164 therebetween. The insulating layer 163 preferably functions as a barrier layer like the insulating layer 152. As the insulating layer 164 in contact with the metal oxide layer 165, an oxide insulating film such as a silicon oxide film is preferably used.

Here, the top surface of the conductive layer 161 is substantially level with the top surface of the insulating layer 162. For example, an opening is provided in the insulating layer 162, the conductive layer 161 is formed to fill the opening, and then planarization treatment is performed by a CMP method or the like, whereby the top surface of the conductive layer 161 and the top surface of the insulating layer 162 can be level with each other. Thus, the size of the transistors 120*a* and 120*b* can be reduced.

The pair of conductive layers 166 are provided apart from each other over the metal oxide layer 165. The pair of conductive layers 166 function as a source and a drain. The insulating layer 181 is provided to cover the metal oxide layer 165 and the pair of conductive layers 166, and the insulating layer 182 is provided over the insulating layer 181. An opening reaching the metal oxide layer 165 is provided in the insulating layer 181 and the insulating layer 182, and the insulating layer 167 and the conductive layer 168 are embedded in the opening. The opening overlaps with the third region. The insulating layer 167 overlaps with a side surface of the insulating layer 181 and a side surface of the insulating layer 182. The conductive layer 168 overlaps with the side surface of the insulating layer 181 and the side surface of the insulating layer 182 with the insulating layer 167 therebetween. The conductive layer 168 functions as a gate electrode, and the insulating layer 167 functions as a gate insulating layer. The conductive layer 168 overlaps with the metal oxide layer 165 with the insulating layer 167 therebetween.

Here, the top surface of the conductive layer 168 is substantially level with the top surface of the insulating layer 182. For example, an opening is provided in the insulating layer 182, the insulating layer 167 and the conductive layer 168 are formed to fill the opening, and then planarization treatment is performed, whereby the top surface of the conductive layer 168 and the top surface of the insulating layer 182 can be level with each other. Thus, the size of the transistors 120*a* and 120*b* can be reduced.

The insulating layer 183 and the insulating layer 185 are provided to cover the top surfaces of the insulating layer 182, the insulating layer 167, and the conductive layer 168. The insulating layer 181 and the insulating layer 183 preferably function as a barrier layer like the insulating layer 152. When the pair of conductive layers 166 are covered with the insulating layer 181, oxidation of the pair of conductive layers 166 due to oxygen contained in the insulating layer 182 can be inhibited.

A plug electrically connected to the conductive layer 187 and one of the pair of conductive layers 166 is embedded in an opening provided in the insulating layer 181, the insulating layer 182, the insulating layer 183, and the insulating layer 185. The plug preferably includes the conductive layer 184*b* in contact with the side surface of the opening and the top surface of one of the pair of conductive layers 166, and the conductive layer 184*a* embedded inside the conductive layer 184*b*. In this case, a conductive material in which hydrogen and oxygen are less likely to diffuse is preferably used for the conductive layer 184*b*.

In FIG. 1, the conductive layer 187 is provided over the insulating layer 185, and the insulating layer 186 is provided over the conductive layer 187. An opening reaching the conductive layer 187 is provided in the insulating layer 186, and the conductive layer 189 is embedded in the opening. Alternatively, as illustrated in FIG. 2(B), the conductive layer 187 and the insulating layer 186 may be provided over the insulating layer 185, and the insulating layer 188 may be provided over the conductive layer 187. Here, the top surface of the conductive layer 187 is level or substantially level with the top surface of the insulating layer 186. For example, the top surface of the conductive layer 187 and the top surface of the insulating layer 186 can be level with each other by providing an opening in the insulating layer 186, forming the conductive layer 187 to fill the opening, and performing planarization treatment by a CMP method or the like. In FIG. 2(B), an opening reaching the conductive layer 187 is provided in the insulating layer 188, and the conductive layer 189 is embedded in the opening. The conductive layer 189 functions as a plug for electrically connecting the conductive layer 187 to the conductive layer 190*a* or the conductive layer 190*c*.

One of the pair of conductive layers 166 of the transistor 120*a* is electrically connected to the conductive layer 190*a* through the conductive layer 184*a*, the conductive layer 184*b*, the conductive layer 187, and the conductive layer 189.

Similarly, one of the pair of conductive layers 166 of the transistor 120*b* is electrically connected to the conductive layer 190*e* through the conductive layer 184*a*, the conductive layer 184*b*, the conductive layer 187, and the conductive layer 189.

Examples of materials that can be used for the conductive layers included in the display device of this embodiment include a metal such as aluminum, titanium, chromium, nickel, copper, yttrium, zirconium, molybdenum, silver, tantalum, and tungsten and an alloy containing any of these metals as its main component. A single layer or a stack including a film containing any of these materials can be used. For example, it is possible to employ a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, or a three-layer structure in which an aluminum film or a copper film is stacked over a molybdenum film or a molybdenum nitride film and a molybdenum film or a molybdenum nitride film is formed thereover. Note that an oxide such as indium oxide, tin oxide, or zinc oxide may be used. Copper containing manganese is preferably used because it increases the shape controllability by etching.

Examples of materials that can be used for the insulating layers included in the display device of this embodiment include a resin such as an acrylic resin, a polyimide resin, an epoxy resin, and a silicone resin and an inorganic insulating material such as silicon oxide, silicon oxynitride, silicon nitride oxide, silicon nitride, and aluminum oxide.

Note that the circuit board 150B may include one or both of a reflective layer that reflects light of a light-emitting diode and a light-blocking layer that blocks the light.

As illustrated in FIG. 1, the electrodes 112*a*, 112*b*, 116*a*, and 116*b*, which are provided in the LED substrate 150A, are electrically connected to a corresponding one of the conductive layers 190*a*, 190*b*, 190*c*, and 190*d*, which are provided in the circuit board 150B.

For example, the electrode 116*a* and the conductive layer 190*a* are electrically connected to each other through a conductor 117*a*. Thus, the transistor 120*a* and the light-emitting diode 110*a* can be electrically connected to each other. The electrode 116*a* functions as a pixel electrode of the light-emitting diode 110*a*.

The electrode 112_a_ and the conductive layer 190_b_ are electrically connected to each other through a conductor 117_b_. The electrode 112_a_ functions as a common electrode of the light-emitting diode 110_a_.

Similarly, the electrode 116_b_ and the conductive layer 190_c_ are electrically connected to each other through a conductor 117_c_, Thus, the transistor 120_b_ and the light-emitting diode 110_b_ can be electrically connected to each other. The electrode 116_b_ functions as a pixel electrode of the light-emitting diode 110_b_.

The electrode 112_b_ and the conductive layer 190_d_ are electrically connected to each other through a conductor 117_d_. The electrode 112_b_ functions as a common electrode of the light-emitting diode 110_b_.

For the conductors 117_a_ to 117_d_, for example, a conductive paste of silver, carbon, copper, or the like or a bump of gold, solder, or the like can be favorably used. For the electrodes 112_a_, 112_b_, 116_a_, and 116_b_ and the conductive layers 190_a_ to 190_d_, which are connected to the conductors 117_a_ to 117_d_, a conductive material having a low contact resistance with the conductors 117_a_ to 117_d_ is preferably used. When a silver paste is used for the conductors 117_a_ to 117_d_, for example, a conductive material connected to these conductors is preferably aluminum, titanium, copper, an alloy containing silver (Ag), palladium (Pd), and copper (Cu) (Ag—Pd—Cu (APC)), or the like, in which case a low contact resistance is achieved.

FIG. 2(C) illustrates an example in which the conductors 117_a_ to 117_d_ are provided on the circuit board 150E side, and the LED substrate 150A and the circuit board 150B are attached to each other. Alternatively, the conductors 117_a_ to 117_d_ may be provided on the LED substrate 150A side, and the LED substrate 150A and the circuit board 150B may be attached to each other.

Note that a plurality of light-emitting diodes may be electrically connected to one transistor.

Figure 3:
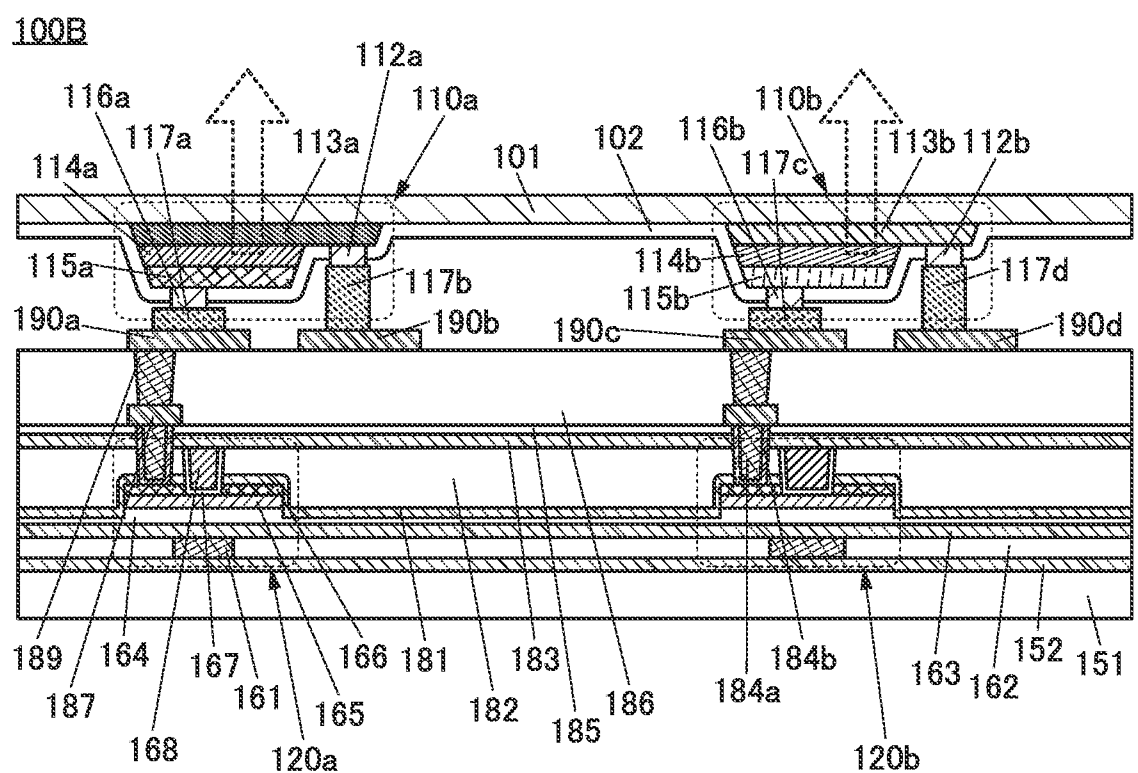
FIG. 3 is a cross-sectional view illustrating an example of a display device.

Next, a cross-sectional view of a display device 100B is shown in FIG. 3.

The display device 100B is an example in which the transistor 120_a_ and the transistor 120_b_ have different channel lengths. The other components are similar to those of the display device 100A.

The transistor 120_a_ for driving the light-emitting diode 110_a_ and the transistor 120_b_ for driving the light-emitting diode 110_b_ may differ in at least one of the transistor size, the channel length, the channel width, the structure, and the like. For example, when the light-emitting diode 110_a_ and the light-emitting diode 110_b_ emit light of different colors, the structure of the transistor may be changed for each color. Specifically, depending on the amount of current required for light emission with desired luminance, one or both of the channel length and the channel width of the transistor may be changed for each color.

Figure 4:
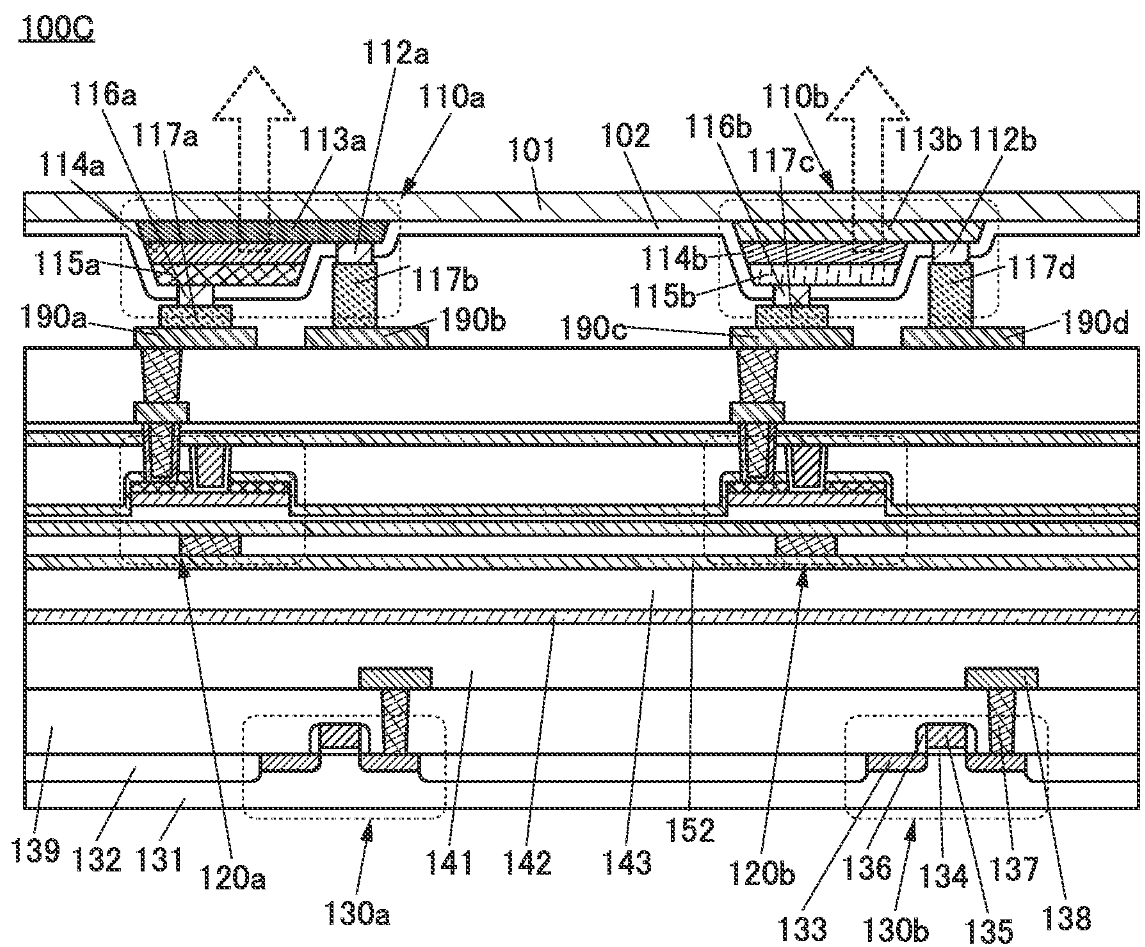
FIG. 4 is a cross-sectional view illustrating an example of a display device.

Next, a cross-sectional view of a display device 1000 is shown in FIG. 4.

The display device 100E includes a stack of transistors including a channel formation region in a substrate 131 (transistors 130_a_ and 130_b_) and transistors including a channel formation region in a metal oxide (the transistors 120_a_ and 120_b_).

A single crystal silicon substrate is suitable for the substrate 131. The transistors 130_a_ and 130_b_ each include a conductive layer 135, an insulating layer 134, an insulating layer 136, and a pair of low-resistance regions 133. The conductive layer 135 functions as a gate. The insulating layer 134 is positioned between the conductive layer 135 and the substrate 131 and functions as a gate insulating layer. The insulating layer 136 is provided to cover a side surface of the conductive layer 135 and functions as a sidewall. The pair of low-resistance regions 133 are regions doped with an impurity in the substrate 131; one of them functions as a source of the transistor and the other functions as a drain of the transistor.

An element isolation layer 132 is provided between two adjacent transistors to be embedded in the substrate 131.

An insulating layer 139 is provided to cover the transistors 130_a_ and 130_b_, and a conductive layer 138 is provided over the insulating layer 139. The conductive layer 138 is electrically connected to one of the pair of low-resistance regions 133 through a conductive layer 137 embedded in an opening in the insulating layer 139. An insulating layer 141 is provided to cover the conductive layer 138, and a conductive layer 142 is provided over the insulating layer 141. The conductive layer 138 and the conductive layer 142 each function as a wiring. An insulating layer 143 and the insulating layer 152 are provided to cover the conductive layer 142, and the transistors 120_a_ and 120_b_ are provided over the insulating layer 152. The stacked-layer structure from the insulating layer 152 to the substrate 101 is the same as that in the display device 100A; thus, detailed description thereof is omitted.

The transistors 120_a_ and 120_b_ can be used as a transistor included in a pixel circuit. The transistors 130_a_ and 130_b_ can be used as a transistor included in a pixel circuit or a transistor included in a driver circuit for driving the pixel circuit (one or both of a gate driver and a source driver). Moreover, the transistors 120_a_, 120_b_, 130_a_, and 130_b_ can be used as transistors included in a variety of circuits such as an arithmetic circuit and a memory circuit.

With such a structure, not only the pixel circuits but also the driver circuit or the like can be formed directly under the light-emitting diodes; thus, the display device can be downsized as compared with the case where the driver circuit is provided outside a display portion. In addition, the display device can have a narrow frame (a narrow non-display region).

[Structure Example 2 of Display Device]

Figure 5A:
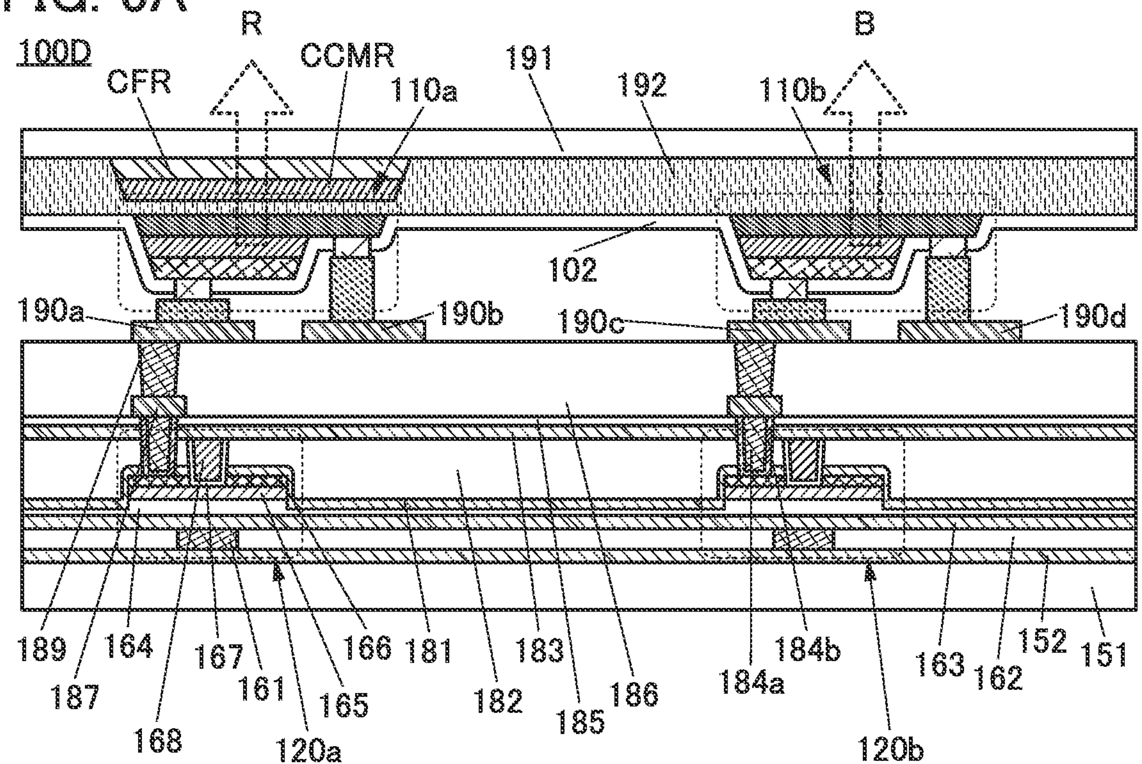
FIG. 5(A) and FIG. 5(B) are cross-sectional views each illustrating an example of a display device.
Figure 5B:
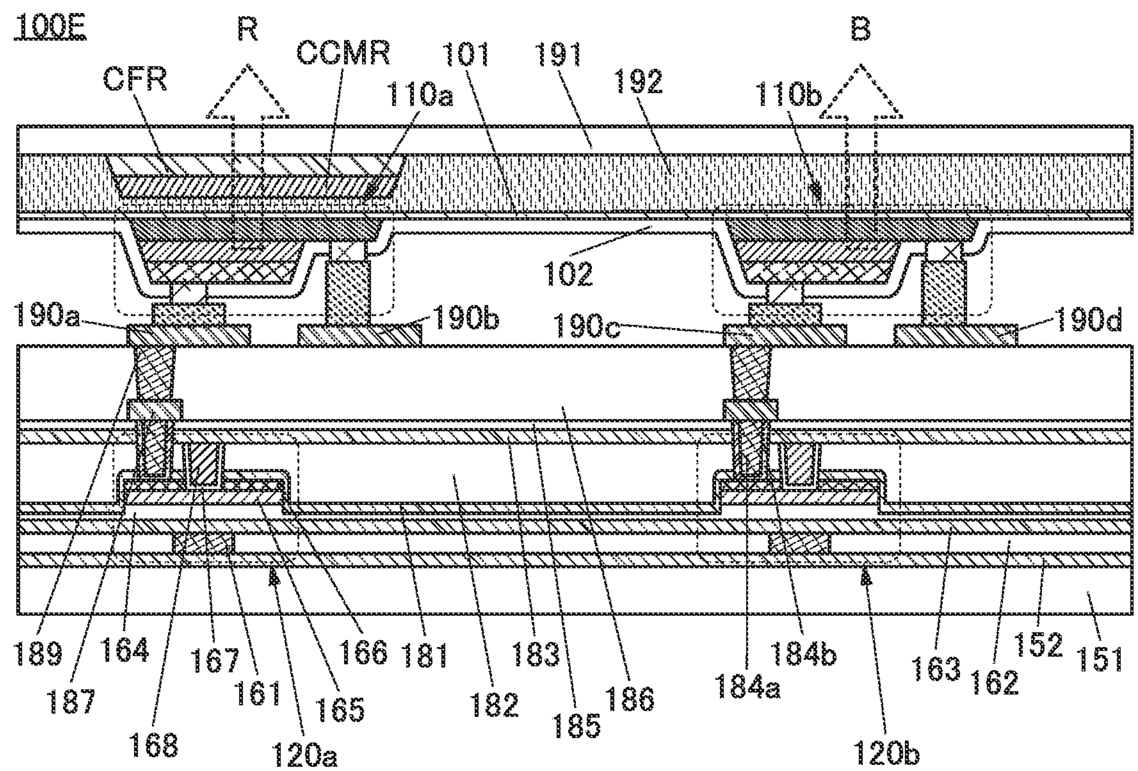

FIG. 5(A) is a cross-sectional view of a display device 100D, and FIG. 5(B) is a cross-sectional view of a display device 100E.

In the display device 100D and the display device 100E, the pixels of each color include light-emitting diodes that emit light of the same color.

The display device 100D and the display device 100E each include a substrate 191 provided with a coloring layer CFR and a color conversion layer CCMR.

Specifically, the substrate 191 includes the coloring layer CFR and the color conversion layer CCMR in a region overlapping with the light-emitting diode 110_a_ included in a red pixel. The color conversion layer CCMR has a function of converting blue light into red light.

In FIG. 5(A) and FIG. 5(B), light emitted from the light-emitting diode 110_a_ included in the red pixel is converted from blue light into red light by the color conversion layer CCMR, the purity of the red light is improved by the coloring layer CFR, and the red light is emitted to the outside of the display device 100D or the display device 100E.

Although not illustrated, the substrate 191 similarly includes a green coloring layer and a color conversion layer that converts blue light into green light in a region overlapping with a light-emitting diode included in a green pixel. Thus, light emitted from the light-emitting diode included in the green pixel is converted from blue light into green light by the color conversion layer, the purity of the green light is improved by the coloring layer, and the green light is emitted to the outside of the display device.

On the other hand, a color conversion layer is not provided in a region of the substrate 191 that overlaps with the light-emitting diode 110*b* included in a blue pixel. The substrate 191 may include a blue coloring layer in the region overlapping with the light-emitting diode 110*b* included in the blue pixel. When a blue coloring layer is provided, the purity of blue light can be improved. When a blue coloring layer is not provided, the manufacturing process can be simplified.

Blue light emitted from the light-emitting diode 110*b* is emitted to the outside of the display device 100D or the display device 100E through an adhesive layer 192 and the substrate 191.

In manufacturing a display device in which the pixels of each color include light-emitting diodes having the same structure, only light-emitting diodes of the same type need to be formed over a substrate; hence, a manufacturing apparatus and manufacturing process can be simplified compared to the case where a plurality of types of light-emitting diodes are formed.

Since the substrate 191 is positioned on the side where light from the light-emitting diode is extracted, a material having a high visible light transmitting property is preferably used for the substrate 191. Examples of a material that can be used for the substrate 191 include glass, quartz, ceramics, sapphire, and a resin. A film such as a resin film may be used as the substrate 191. In that case, the display device can be reduced in weight and thickness.

For the color conversion layer, a phosphor or a quantum dot (QD) is preferably used. In particular, a quantum dot has an emission spectrum with a narrow peak, so that emission with high color purity can be obtained. Accordingly, the display quality of the display device can be improved.

The color conversion layer can be formed by a droplet discharge method (e.g., an inkjet method), a coating method, an imprinting method, a variety of printing methods (screen printing or offset printing), or the like. Alternatively, a color conversion film such as a quantum dot film may be used.

There is no particular limitation on a material of a quantum dot, and examples include a Group 14 element, a Group 15 element, a Group 16 element, a compound of a plurality of Group 14 elements, a compound of an element belonging to any of Group 4 to Group 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and a variety of semiconductor clusters.

Specific examples include cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and combinations thereof. What is called an alloyed quantum dot, whose composition is represented by a given ratio, may be used.

Examples of the quantum dots include core-type quantum dots, core-shell quantum dots, and core-multishell quantum dots. Quantum dots have a high proportion of surface atoms and thus have high reactivity and easily aggregate together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability.

Since band gaps of quantum dots increase as their size decreases, the size is adjusted as appropriate so that light with a desired wavelength can be obtained. Light emission from the quantum dots is shifted to a blue color side, i.e., a high energy side, as the crystal size becomes smaller; thus, the emission wavelengths of the quantum dots can be adjusted over a wavelength range of a spectrum of an ultraviolet region, a visible light region, and an infrared region by changing the size of quantum dots. The size (diameter) of the quantum dots are within the range of 0.5 nm to 20 nm, preferably within the range of 1 nm to 10 nm, for example. The emission spectra are narrowed as the size distribution of the quantum dots gets smaller, and thus light can be obtained with high color purity. The shape of the quantum dots is not particularly limited and may be a spherical shape, a rod shape, a circular shape, or the like. Quantum rods, which are rod-shaped quantum dots, have a function of emitting directional light.

The coloring layer is a colored layer that transmits light in a specific wavelength range. For example, a color filter that transmits light in a red, green, blue, or yellow wavelength range can be used. Examples of a material that can be used for the coloring layer include a metal material, a resin material, and a resin material containing a pigment or a dye.

The display device 100D can be manufactured in the following manner: first, the circuit board and the LED substrate are attached to each other as in the display device 100A, and then the substrate 101 of the LED substrate is separated, and the substrate 191 provided with the coloring layer CFR, the color conversion layer CCMR, and the like is attached to the surface exposed by the separation with the use of the adhesive layer 192.

Figure 6A:
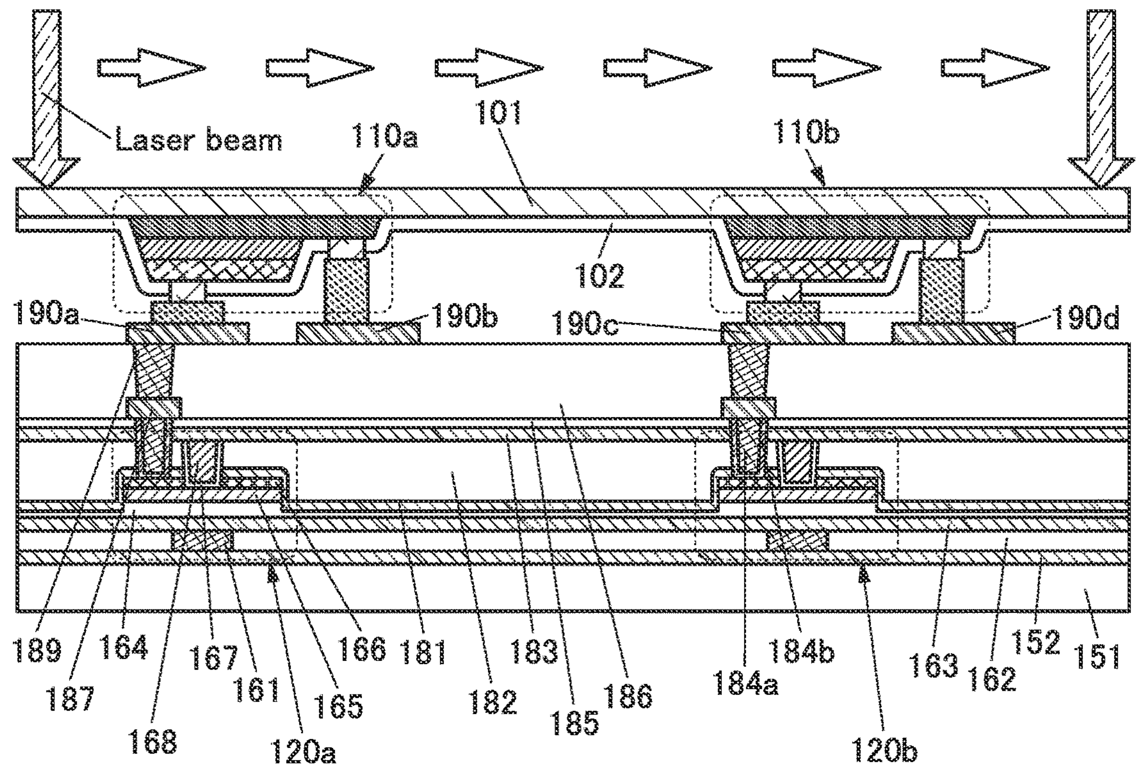
FIG. 6(A) and FIG. 6(B) are cross-sectional views illustrating an example of a method for manufacturing a display device.

There is no limitation on the method for separating the substrate 101; for example, a method in which the entire surface of the substrate 101 is irradiated with laser light (Laser beam) as illustrated in FIG. 6(A) may be employed.

Figure 6B:
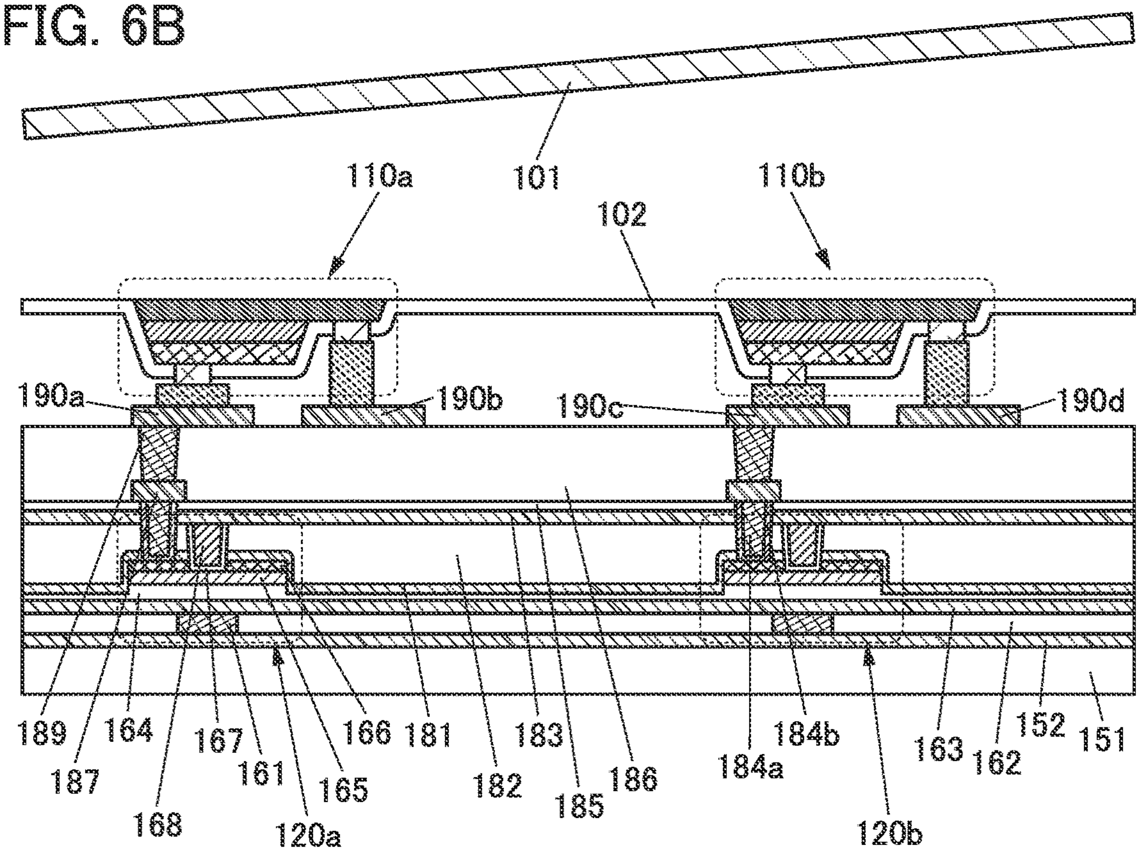

Thus, the substrate 101 can be separated, and the protective layer 102 and the light-emitting diodes 110*a* and 110*b* can be exposed (FIG. 6(B)).

As the laser, an excimer laser, a solid-state laser, and the like can be used. For example, a diode-pumped solid-state laser (DPSS) may be used.

A separation layer may be provided between the substrate 101 and the light-emitting diodes 110*a* and 110*b*.

The separation layer can be formed using an organic material or an inorganic material.

Examples of the organic material that can be used for the separation layer include a polyimide resin, an acrylic resin, an epoxy resin, a polyamide resin, a polyimide-amide resin, a siloxane resin, a benzocyclobutene-based resin, and a phenol resin.

Examples of the inorganic material that can be used for the separation layer include a metal containing an element selected from tungsten, molybdenum, titanium, tantalum, niobium, nickel, cobalt, zirconium, zinc, ruthenium, rhodium, palladium, osmium, iridium, and silicon, an alloy containing the element, and a compound containing the element. A crystal structure of a layer containing silicon may be any of amorphous, microcrystal, and polycrystal.

For the adhesive layer 192, a variety of curable adhesives such as a photocurable adhesive such as an ultraviolet curable adhesive, a reactive curable adhesive, a thermosetting adhesive, and an anaerobic adhesive can be used. An adhesive sheet or the like may be used.

Alternatively, as in the display device 100E, the substrate 191 provided with the coloring layer CFR, the color conversion layer CCMR, and the like may be attached to the substrate 101 with the use of the adhesive layer 192. In other words, the substrate 101 is not necessarily separated.

At this time, the substrate 101 is preferably thinned by polishing or the like. This can increase the extraction efficiency of light emitted from the light-emitting diode. In addition, the display device can be thin and lightweight.

The display device 100E can be manufactured in the following manner: first, the circuit board and the LED substrate are attached to each other as in the display device 100A, and then the substrate 101 of the LED substrate is polished, and the substrate 191 provided with the coloring layer CFR, the color conversion layer CCMR, and the like is attached to the polished surface of the substrate 101 with the use of the adhesive layer 192.

[Structure Example 3 of Display Device]

Figure 7:
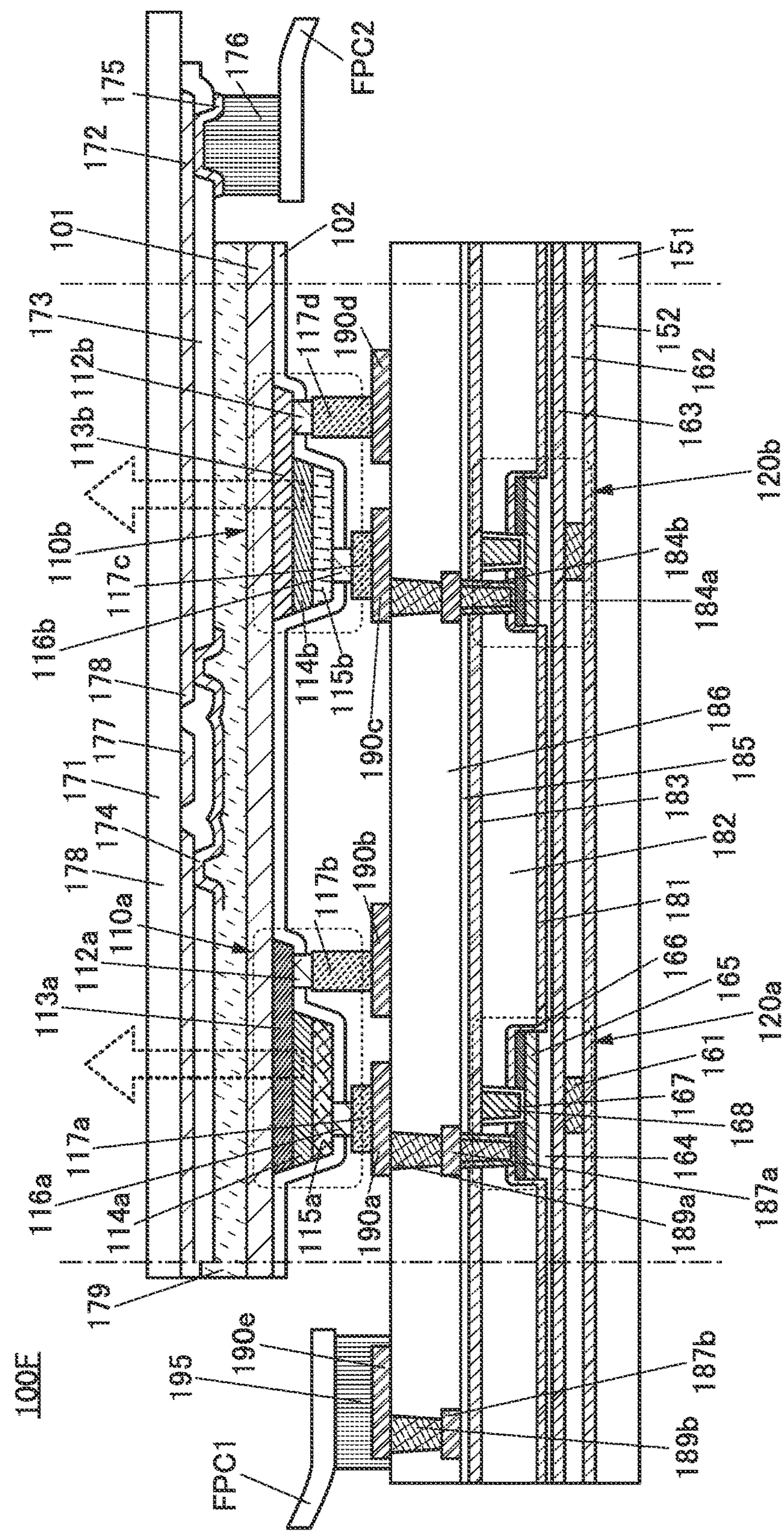
FIG. 7 is a cross-sectional view illustrating an example of a display device.

FIG. 7 is a cross-sectional view of a display device 100F.

The display device of one embodiment of the present invention may be a display device including a touch sensor (also referred to as an input/output device or a touch panel). The structures of the display devices described above can be used for the touch panel. The display device 100F is an example in which a touch sensor is provided in the display device 100A.

There is no limitation on a sensing element (also referred to as a sensor element) included in the touch panel of one embodiment of the present invention. A variety of sensors capable of sensing an approach or a contact of a sensing target such as a finger or a stylus can be used as the sensing element.

For example, a variety of types such as a capacitive type, a resistive type, a surface acoustic wave type, an infrared type, an optical type, and a pressure-sensitive type can be used for the sensor.

In this embodiment, a touch panel including a capacitive sensing element is described as an example.

Examples of the capacitive type include a surface-capacitive type and a projected-capacitive type. Examples of the projected-capacitive type include a self-capacitive type and a mutual-capacitive type. The use of the mutual-capacitive type is preferable because multiple points can be sensed simultaneously.

The touch panel of one embodiment of the present invention can have a variety of structures, including a structure in which a display device and a sensing element that are separately formed are attached to each other and a structure in which electrodes and the like included in a sensing element are provided on one or both of a substrate supporting a display element and a counter substrate.

The stacked-layer structure from the substrate 151 to the substrate 101 in the display device 100F is the same as that in the display device 100A; thus, detailed description thereof is omitted.

A conductive layer 187*b* is electrically connected to FPC1 through a conductive layer 189*b*, a conductive layer 190*e*, and a conductor 195. The display device 100F is supplied with a signal and power through FPC1.

The conductive layer 187*b* can be formed using the same material and the same step as the conductive layer 187*a*. The conductive layer 189*b* can be formed using the same material and the same step as the conductive layer 189*a*. The conductive layer 190*e* can be formed using the same material and the same step as the conductive layers 190*a* to 190*d*.

As the conductor 195, for example, an anisotropic conductive film (ACF) or an anisotropic conductive paste (ACP) can be used.

A substrate 171 is provided with a touch sensor. The substrate 171 and the substrate 101 are attached to each other with an adhesive layer 179 such that the surface of the substrate 171 where the touch sensor is provided faces the substrate 101.

An electrode 177 and an electrode 178 are provided on a surface of the substrate 171 facing the substrate 101. The electrode 177 and the electrode 178 are formed on the same plane. A material that transmits visible light is used for the electrode 177 and the electrode 178. An insulating layer 173 is provided to cover the electrode 177 and the electrode 178. An electrode 174 is electrically connected to two electrodes 178 between which the electrode 177 is positioned, through openings provided in the insulating layer 173.

A wiring 172 that is obtained by processing the same conductive layer as the electrodes 177 and 178 is connected to a conductive layer 175 that is obtained by processing the same conductive layer as the electrode 174. The conductive layer 175 is electrically connected to FPC2 through a connector 176.

[Structure Example of Transistor]

The transistor that can be used in the display device of one embodiment of the present invention is not limited to having the structure of the transistors 120*a* and 120*b* illustrated in FIG. 1 and the like. Structure examples of transistors that can be used in the display device of one embodiment of the present invention are described below with reference to FIG. 8 and FIG. 9.

Figure 8A:
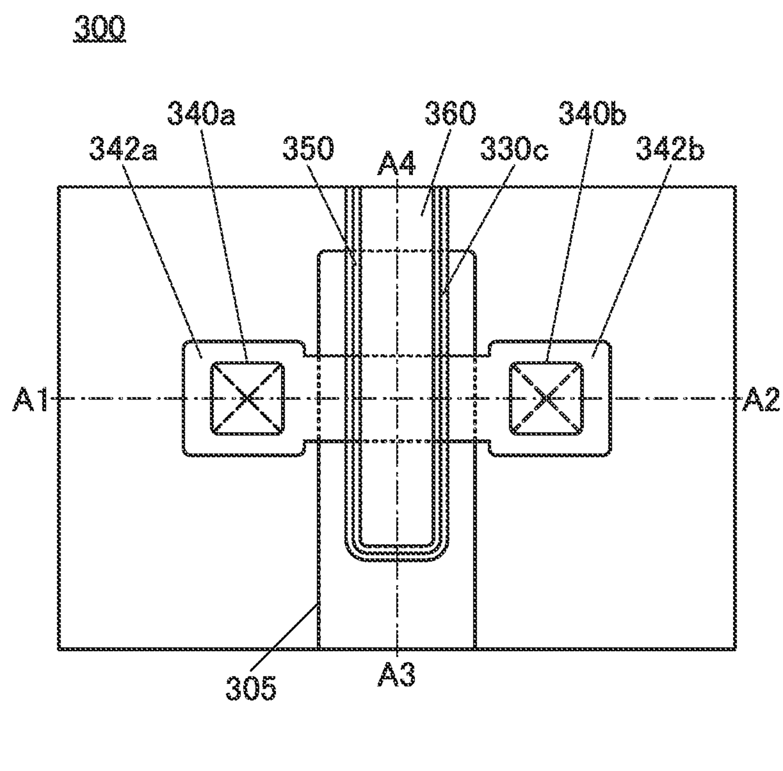
FIG. 8(A) is a top view illustrating an example of a transistor.
Figure 8C:
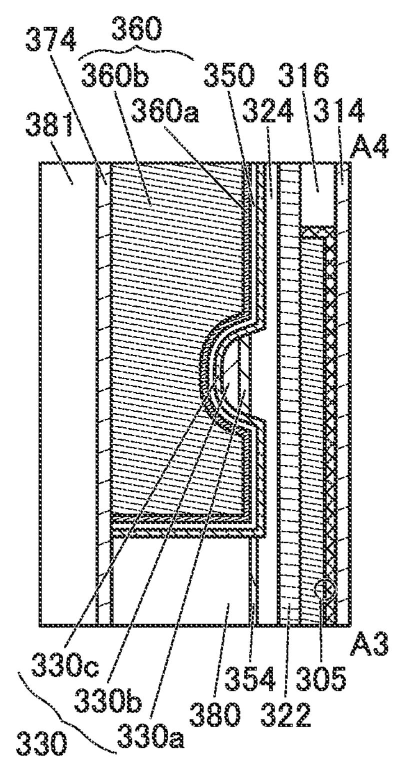
FIG. 8(B) and FIG. 8(C) are cross-sectional views illustrating the example of the transistor.
Figure 8B:
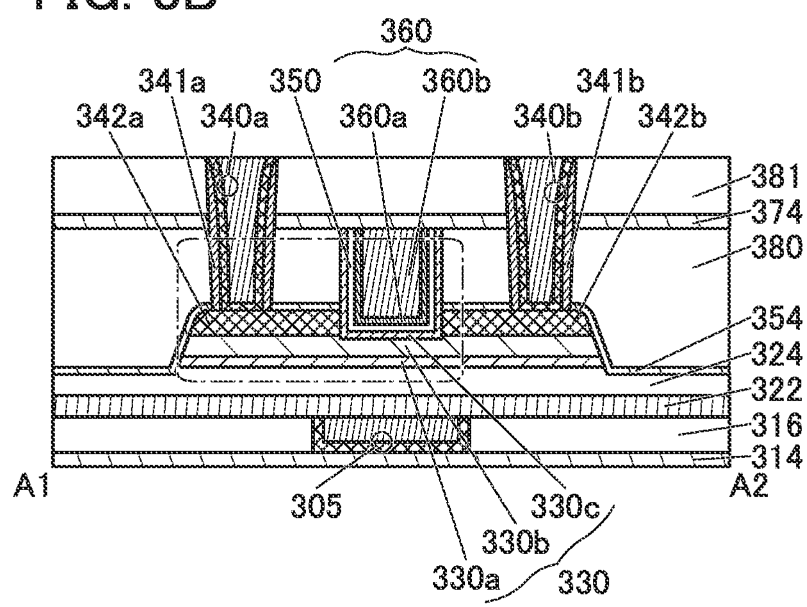

FIG. 8(A) is a top view of a transistor 300. Note that for simplification of the drawing, some components are not illustrated in FIG. 8(A). FIG. 8(B) is a cross-sectional view along the dashed-dotted line A1-A2 in FIG. 8(A). FIG. 8(B) can be referred to as a cross-sectional view of the transistor 300 in the channel length direction. FIG. 8(C) is a cross-sectional view along the dashed-dotted line A3-A4 in FIG. 8(A). FIG. 8(C) can be referred to as a cross-sectional view of the transistor 300 in the channel width direction.

Figure 9A:
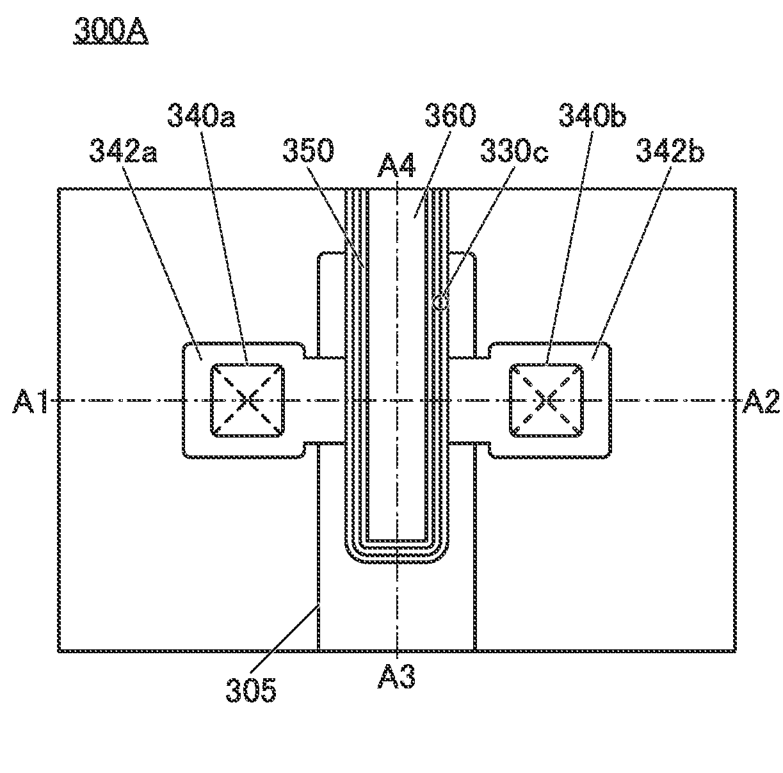
FIG. 9(A) is a top view illustrating an example of a transistor.
Figure 9C:
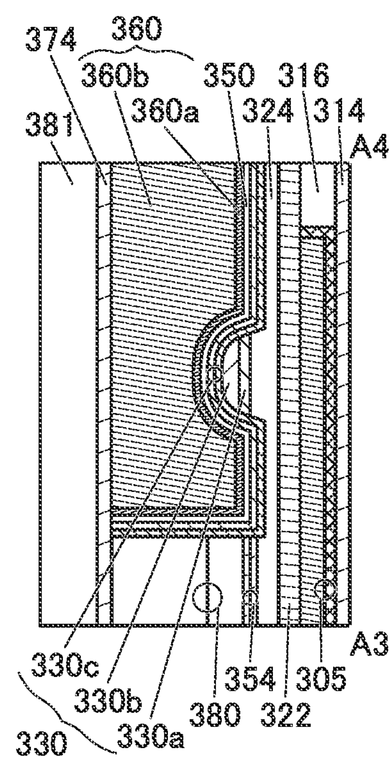
FIG. 9(B) and FIG. 9(C) are cross-sectional views illustrating the example of the transistor.
Figure 9B:
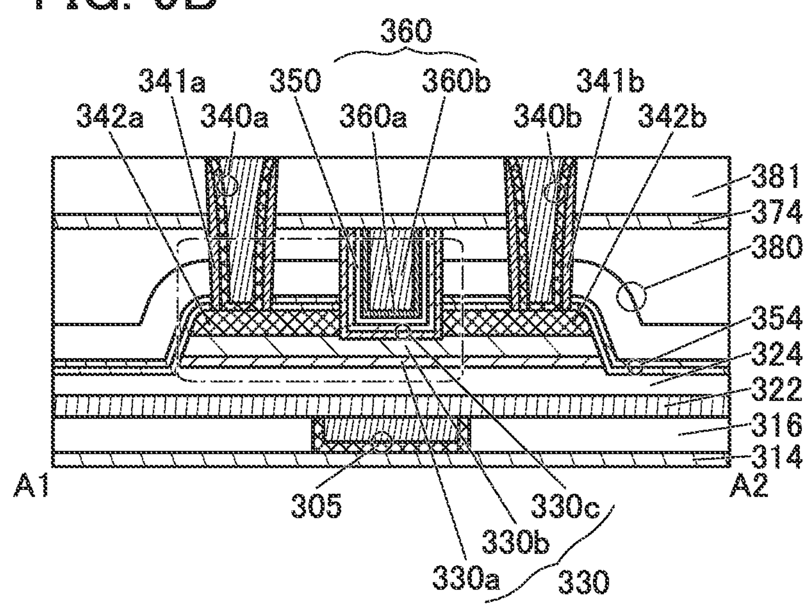

FIG. 9(A) is a top view of a transistor 300A. Note that for simplification of the drawing, some components are not illustrated in FIG. 9(A). FIG. 9(B) is a cross-sectional view along the dashed-dotted line A1-A2 in FIG. 9(A). FIG. 9(B) can be referred to as a cross-sectional view of the transistor 300A in the channel length direction. FIG. 9(C) is a cross-sectional view along the dashed-dotted line A3-A4 in FIG. 9(A). FIG. 9(C) can be referred to as a cross-sectional view of the transistor 300A in the channel width direction.

Note that the transistor 300A illustrated in FIG. 9 is a variation example of the transistor 300 illustrated in FIG. 8. An oxide layer 330*c*, an insulating layer 354, and an insulating layer 380 each have a single-layer structure in FIG. 8, and each have a stacked-layer structure in FIG. 9. The other components are the same between FIG. 8 and FIG. 9.

Note that in this specification and the like, a transistor is an element having at least three terminals of a gate, a drain, and a source. The transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. In this specification and the like, a channel formation region refers to a region through which current mainly flows.

Functions of a source and a drain might be interchanged with each other when a transistor of opposite polarity is employed or when the direction of current is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, and the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, and the average value in a channel formation region.

Note that in this specification and the like, depending on the transistor structure, a channel width in a region where a channel is actually formed (hereinafter also referred to as an effective channel width) is sometimes different from a channel width shown in a top view of a transistor (hereinafter also referred to as an apparent channel width). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to apparent channel width in some cases. Alternatively, in this specification, the simple term "channel width" refers to effective channel width in some cases. Note that values of channel length, channel width, effective channel width, apparent channel width, and the like can be determined, for example, by analyzing a cross-sectional TEM image and the like.

The transistor 300 includes a conductive layer 305 that is positioned over a substrate (not illustrated) with an insulating layer 314 therebetween and is positioned to be embedded in an insulating layer 316; an insulating layer 322 positioned over the insulating layer 316 and the conductive layer 305; an insulating layer 324 positioned over the insulating layer 322; an oxide layer 330 (an oxide layer 330*a*, an oxide layer 330*b*, and the oxide layer 330*c*) positioned over the insulating layer 324; an insulating layer 350 positioned over the oxide layer 330; a conductive layer 360 (a conductive layer 360*a* and a conductive layer 360*b*) positioned over the insulating layer 350; a conductive layer 342*a* and a conductive layer 342*b* in contact with part of the top surface of the oxide layer 330*b*; and the insulating layer 354 positioned in contact with part of the top surface of the insulating layer 324, the side surface of the oxide layer 330*a*, the side surface of the oxide layer 330*b*, the side surface and the top surface of the conductive layer 342*a*, and the side surface and the top surface of the conductive layer 342*b*.

The insulating layer 380, an insulating layer 374, and an insulating layer 381 each of which functions as an interlayer film are provided over the transistor 300. The transistor 300 is electrically connected to a conductive layer 340 (a conductive layer 340*a* and a conductive layer 340*b*) functioning as a plug. An insulating layer 341 (an insulating layer 341*a* and an insulating layer 341*b*) is provided in contact with a side surface of the conducting layer 340.

The oxide layer 330 preferably includes the oxide layer 330*a* positioned over the insulating layer 324, the oxide layer 330*b* positioned over the oxide layer 330*a*, and the oxide layer 330*c* that is positioned over the oxide layer 330*b* and is at least partly in contact with the top surface of the oxide layer 330*b*. When the oxide layer 330*a* is provided under the oxide layer 330*b*, diffusion of impurities into the oxide layer 330*b* from the components formed below the oxide layer 330*a* can be inhibited. When the oxide layer 330*c* is provided over the oxide layer 330*b*, diffusion of impurities into the oxide layer 330*b* from the components formed above the oxide layer 330*c* can be inhibited.

Although an example is shown in which the oxide layer 330 in the transistor 300 has a three-layer structure of the oxide layer 330*a*, the oxide layer 330*b*, and the oxide layer 330*c*, the present invention is not limited thereto. For example, the oxide layer 330 may have a single-layer structure of the oxide layer 330*b*, a two-layer structure of the oxide layer 330*a* and the oxide layer 330*b*, a two-layer structure of the oxide layer 330*b* and the oxide layer 330*c*, or a stacked-layer structure of four or more layers. Alternatively, each of the oxide layer 330*a*, the oxide layer 330*b*, and the oxide layer 330*c* may have a stacked-layer structure.

The conductive layer 342 (the conductive layer 342*a* and the conductive layer 342*b*) is provided over the oxide layer 330*b*. The thickness of the conductive layer 342 can be greater than or equal to 1 nm and less than or equal to 50 nm, preferably greater than or equal to 2 nm and less than or equal to 25 nm, for example.

The conductive layer 360 functions as a first gate (also referred to as top gate) electrode of the transistor 300, and the conductive layer 342*a* and the conductive layer 342*b* function as a source electrode and a drain electrode of the transistor 300.

In the transistor 300, a metal oxide functioning as a semiconductor (hereinafter also referred to as an oxide semiconductor) is preferably used in the oxide layer 330 including a channel formation region. When an oxide semiconductor is used in a channel formation region of a transistor, a transistor having high field-effect mobility can be achieved. In addition, a transistor having high reliability can be achieved.

As the metal oxide, it is preferable to use a metal oxide having a band gap of 2.0 eV or more, preferably 2.5 eV or more. The use of a metal oxide having a wide band gap for the oxide layer 330 can reduce the of state current of the transistor. The use of such a transistor can provide a display device with low power consumption.

For example, for the oxide layer 330, a metal oxide such as an In-M-Zn oxide containing indium (In), an element M, and zinc (Zn) (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or an M-Zn oxide may be used for the oxide layer 330.

A metal oxide with a low carrier density is preferably used in the transistor 300. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Examples of impurities in a metal oxide include hydrogen, nitrogen, alkali metal, alkaline earth metal, iron, nickel, and silicon.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. In some cases, a defect that is an oxygen vacancy into which hydrogen enters functions as a donor and generates an electron serving as a carrier. In some cases, bonding of part of hydrogen to oxygen bonded to a metal atom generates electrons serving as carriers. Thus, a transistor using a metal oxide containing a large amount of hydrogen is likely to have normally-on characteristics.

Consequently, when a metal oxide is used for the oxide layer 330, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide layer 330, contact between the conductive layer 342 (the conductive layer 342*a* and the conductive layer 342*b*) and the oxide layer 330 may make oxygen in the oxide layer 330 diffuse into the conductive layer 342, resulting in oxidation of the conductive layer 342. It is highly possible that oxidation of the conductive layer 342 lowers the conductivity of the conductive layer 342. Note that diffusion of oxygen in the oxide layer 330 into the conductive layer 342 can be interpreted as absorption of oxygen in the oxide layer 330 by the conductive layer 342.

When oxygen in the oxide layer 330 diffuses into the conductive layer 342 (the conductive layer 342*a* and the conductive layer 342*b*), a layer may be formed between the conductive layer 342*a* and the oxide layers 330*b* and 330*c* and between the conductive layer 342*b* and the oxide layers 330*b* and 330*c*. The layer contains more oxygen than the conductive layer 342 does, and thus presumably has an insulating property. In this case, a three-layer structure of the conductive layer 342, the layer, and the oxide layer 330*b* or the oxide layer 330*c* can be regarded as a three-layer structure of a metal, an insulator, and a semiconductor and is sometimes referred to as a MIS (Metal-Insulator-Semiconductor) structure.

In view of the above, the conductive layer 342 (the conductive layer 342*a* and the conductive layer 342*b*) is preferably formed using a conductive material having properties with which hydrogen in the oxide layer 330 is likely to diffuse into the conductive layer 342 and oxygen in the oxide layer 330 is less likely to diffuse into the conductive layer 342. Thus, with hydrogen in the oxide layer 330 diffusing into the conductive layer 342, the hydrogen concentration of the oxide layer 330 is reduced, and the transistor 300 can have stable electrical characteristics. Note that in this specification and the like, ease of diffusion of hydrogen in an oxide into a conductive layer is sometimes expressed by "the conductive layer is likely to extract (likely to absorb) hydrogen in the oxide". Moreover, difficulty of diffusion of oxygen in an oxide into a conductive layer is sometimes expressed by "the conductive layer is less likely to be oxidized" and "the conductive layer is resistant to oxidation", for example.

An example of the conductive material includes a conductor containing tantalum (Ta), titanium (Ti), or the like. In particular, a conductor containing tantalum is preferably used for the conductive layer 342. A conductor containing tantalum may contain nitrogen or may contain oxygen. Accordingly, the composition formula of the conductor containing tantalum preferably satisfies $TaN_xO_y$ (x is a real number greater than 0 and less than or equal to 1.67 and y is a real number greater than or equal to 0 and less than or equal to 1.0). Examples of the conductor containing tantalum include tantalum, tantalum oxide, tantalum nitride, tantalum nitride oxide, and tantalum oxynitride. In view of this, the conductor containing tantalum is sometimes referred to as $TaN_xO_y$ in this specification and the like.

In $TaN_xO_y$, the proportion of tantalum is preferably high. Alternatively, the proportions of nitrogen and oxygen are preferably low; i.e., x and y are preferably small. The increase in the proportion of tantalum lowers the resistivity of $TaN_xO_y$ and enables the transistor 300 using the $TaN_xO_y$ for the conductive layer 342 to have favorable electrical characteristics.

Alternatively, in $TaN_xO_y$, the proportion of nitrogen is preferably high; i.e., x is preferably large. The use of $TaN_xO_y$ with a high proportion of nitrogen for the conductive layer 342 can inhibit oxidation of the conductive layer 342. Moreover, the thickness of a layer formed between the conductive layer 342 and the oxide layer 330 can be reduced.

Note that hydrogen diffusing into the conductive layer 342 sometimes remains in the conductive layer 342. That is, hydrogen in the oxide layer 330 is sometimes absorbed by the conductive layer 342. In some cases, hydrogen in the oxide layer 330 passes through the conductive layer 342 and is released to a component provided around the conductive layer 342 or the outside of the transistor 300.

In order to reduce the hydrogen concentration of the oxide layer 330 and to inhibit formation of a layer between the conductive layer 342 and the oxide layer 330, it is preferred that the conductive layer 342 be formed using a conductive material having a property with which hydrogen in the oxide layer 330 is likely to diffuse into the conductive layer 342, and that a layer having a function of inhibiting oxidation of the conductive layer 342 be provided between the conductive layer 342 and the oxide layer 330. Providing the layer makes the conductive layer 342 and the oxide layer 330 not in contact with each other, thereby inhibiting absorption of oxygen in the oxide layer 330 by the conductive layer 342.

The detailed structure of the transistor 300 is described below.

The insulating layer 314 preferably functions as an insulating barrier film that inhibits diffusion of impurities such as water and hydrogen from the substrate side into the transistor 300. Thus, for the insulating layer 314, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use an insulating material having a function of inhibiting diffusion of oxygen (e.g., at least one of an oxygen atom, an oxygen molecule, and the like).

Note that in this specification, a function of inhibiting diffusion of impurities or oxygen means a function of inhibiting diffusion of any one or all of the impurities and the oxygen. A film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A bather film having conductivity is sometimes referred to as a conductive barrier film.

As the insulating layer 314, an aluminum oxide film or a silicon nitride film is preferably used, for example. Thus, impurities such as water and hydrogen can be inhibited from diffusing to the transistor 300 side from the substrate side through the insulating layer 314. Alternatively, oxygen contained in the insulating layer 324 and the like can be inhibited from diffusing to the substrate side through the insulating layer 314. Note that the insulating layer 314 may have a stacked-layer structure of two or more layers. In that case, without limitation to a stacked-layer structure formed of the same material, a stacked-layer structure formed of different materials may be employed. For example, a stack of an aluminum oxide film and a silicon nitride film may be employed.

As another example, as the insulating layer 314, a silicon nitride film formed by a sputtering method is preferably used. In that case, the hydrogen concentration of the insulating layer 314 can be reduced, and impurities such as water and hydrogen can be further inhibited from diffusing to the transistor 300 side from the substrate side through the insulating layer 314.

The dielectric constant of the insulating layer 316 functioning as an interlayer film is preferably lower than that of the insulating layer 314. When a material with a low dielectric constant is used for the interlayer film, the parasitic capacitance generated between wirings can be reduced. As the insulating layer 316, a silicon oxide film, a silicon oxynitride film, a silicon nitride oxide film, a silicon nitride film, a silicon oxide film to which fluorine is added, a silicon oxide film to which carbon is added, a silicon oxide film to which carbon and nitrogen are added, a porous silicon oxide film, or the like is used as appropriate, for example.

The insulating layer 316 preferably includes a region that has a low hydrogen concentration and contains oxygen in excess of that in the stoichiometric composition (hereinafter also referred to as an excess-oxygen region), or preferably contains oxygen that is released by heating (hereinafter also referred to as excess oxygen). For example, a silicon oxide film formed by a sputtering method is preferably used as the insulating layer 316. In that case, entry of hydrogen into the oxide layer 330 can be inhibited; alternatively, oxygen can be supplied to the oxide layer 330 to reduce oxygen vacancies in the oxide layer 330. Consequently, a transistor that has stable electrical characteristics with a small variation in electrical characteristics and improved reliability can be provided.

The insulating layer 316 may have a stacked-layer structure. For example, in the insulating layer 316, an insulating layer similar to the insulating layer 314 may be provided at least in a portion in contact with a side surface of the conductive layer 305. With such a structure, oxidation of the conductive layer 305 due to oxygen contained in the insulating layer 316 can be inhibited. Alternatively, a reduction in the amount of oxygen contained in the insulating layer 316 due to the conductive layer 305 can be inhibited.

The conductive layer 305 sometimes functions as a second gate (also referred to as bottom gate) electrode. In that case, by changing the potential applied to the conductive layer 305 not in conjunction with but independently of the potential applied to the conductive layer 360, the threshold voltage ($V_{th}$) of the transistor 300 can be controlled. In particular, by applying a negative potential to the conductive layer 305, $V_{th}$ of the transistor 300 can be made higher, and its off-state current can be reduced. Thus, a drain current at the time when a potential applied to the conductive layer 360 is 0 V can be lower in the case where a negative potential is applied to the conductive layer 305 than in the case where a negative potential is not applied to the conductive layer 305.

The conductive layer 305 is placed to overlap with the oxide layer 330 and the conductive layer 360. The conductive layer 305 is preferably provided to be embedded in the insulating layer 314 or the insulating layer 316.

The conductive layer 305 is preferably provided larger than the channel formation region in the oxide layer 330, as illustrated in FIG. 8(B). It is particularly preferable that the conductive layer 305 also extend to a region outside an end portion of the oxide layer 330 that intersects with the channel width direction, as illustrated in FIG. 8(C). That is, the conductive layer 305 and the conductive layer 360 preferably overlap with each other with the insulating layers therebetween on the outer side of the side surface of the oxide layer 330 in the channel width direction. With this structure, the channel formation region of the oxide layer 330 can be electrically surrounded by the electric field of the conductive layer 360 functioning as the first gate electrode and the electric field of the conductive layer 305 functioning as the second gate electrode.

As illustrated in FIG. 8(C), the conductive layer 305 is extended to function as a wiring. However, without limitation to this structure, a conductive layer functioning as a wiring may be provided under the conductive layer 305. The conductive layer 305 does not necessarily have to be provided in each transistor. For example, the conductive layer 305 may be shared by a plurality of transistors.

Although an example is shown in which the conductive layer 305 in the transistor 300 has a stacked-layer structure of two layers (a first conductive layer over the insulating layer 314 and a second conductive layer over the first conductive layer), the present invention is not limited thereto. For example, the conductive layer 305 may have a single-layer structure or a stacked-layer structure of three or more layers. In the case where a component has a stacked-layer structure, layers may be distinguished by ordinal numbers corresponding to the formation order.

Here, for the first conductive layer of the conductive layer 305, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom is preferably used. Alternatively, it is preferable to use a conductive material having a function of inhibiting diffusion of oxygen (e.g., at least one of an oxygen atom, an oxygen molecule, and the like).

When a conductive material having a function of inhibiting oxygen diffusion is used for the first conductive layer of the conductive layer 305, a reduction in the conductivity of the second conductive layer of the conductive layer 305 due to oxidation can be inhibited. As a conductive material having a function of inhibiting oxygen diffusion, tantalum, tantalum nitride, ruthenium, or ruthenium oxide is preferably used, for example. Thus, the first conductive layer of the conductive layer 305 preferably has a single-layer structure or a stacked-layer structure using any of the above conductive materials. For example, the first conductive layer of the conductive layer 305 may be a stack of a tantalum film, a tantalum nitride film, a ruthenium film, or a ruthenium oxide film and a titanium film or a titanium nitride film.

For the second conductive layer of the conductive layer 305, a conductive material containing tungsten, copper, or aluminum as its main component is preferably used. Note that the second conductive layer of the conductive layer 305 is shown as a single layer in FIG. 8(B) and the like but may have a stacked-layer structure, for example, a stacked-layer structure of a titanium film or a titanium nitride film and a film containing the above conductive material.

The insulating layer 322 and the insulating layer 324 function as a gate insulating layer.

The insulating layer 322 preferably has a function of inhibiting diffusion of hydrogen (e.g., at least one of a hydrogen atom, a hydrogen molecule, and the like). In addition, the insulating layer 322 preferably has a function of inhibiting diffusion of oxygen (e.g., at least one of an oxygen atom, an oxygen molecule, and the like). For example, the insulating layer 322 preferably inhibits diffusion of one or both of hydrogen and oxygen more than the insulating layer 324.

As the material for the insulating layer 322, an insulator containing an oxide of one or both of aluminum and hafnium, which is an insulating material, is preferably used. Aluminum oxide, hafnium oxide, an oxide containing aluminum and hafnium (hafnium aluminate), or the like is preferably used as the insulator. When the insulating layer 322 is formed using such a material, the insulating layer 322 functions as a layer that inhibits release of oxygen from the oxide layer 330 toward the substrate and diffusion of impurities such as hydrogen from the periphery of the transistor 300 into the oxide layer 330. Thus, providing the insulating layer 322 can inhibit diffusion of impurities such as hydrogen into the transistor 300 and inhibit generation of oxygen vacancies in the oxide layer 330. Moreover, the conductive layer 305 can be inhibited from reacting with oxygen contained in the insulating layer 324 and the oxide layer 330.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of a silicon oxide film, a silicon oxynitride film, or a silicon nitride film over an insulating film containing any of these insulators may be used as the insulating layer 322.

The insulating layer 322 may be formed with a single-layer structure or a stacked-layer structure using an insulating material containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST), for example. As miniaturization and high integration of transistors progress, a problem such as leakage current might arise because of a thinner gate insulating layer. When a high-k material is used for an insulating layer functioning as the gate insulating layer, a gate potential during operation of the transistor can be reduced while the physical thickness is maintained.

It is preferred that the insulating layer 324 in contact with the oxide layer 330 release oxygen by heating. A silicon oxide film, a silicon oxynitride film, or the like is used as appropriate as the insulating layer 324, for example. When an insulating layer containing oxygen is provided in contact with the oxide layer 330, oxygen vacancies in the oxide layer 330 can be reduced and the reliability of the transistor 300 can be improved.

For the insulating layer 324, specifically, an oxide material from which part of oxygen is released by heating is preferably used. An oxide layer that releases oxygen by heating is an oxide layer in which the amount of released oxygen molecules is greater than or equal to $1.0\times10^{18}$ molecules/$cm^3$, preferably greater than or equal to $1.0\times10^{19}$ molecules/$cm^3$, further preferably greater than or equal to $2.0\times10^{19}$ molecules/$cm^3$ or greater than or equal to $3.0\times10^{20}$ molecules/$cm^3$ in TDS (Thermal Desorption Spectroscopy) analysis. Note that the temperature of the film surface in the TDS analysis is preferably within the range of 100° C. to 700° C., or 100° C. to 400° C.

The insulating layer 324 preferably has a low hydrogen concentration and includes an excess-oxygen region or excess oxygen, and may be formed using a material similar to that for the insulating layer 316, for example.

The insulating layer 322 and the insulating layer 324 may each have a stacked-layer structure of two or more layers. In such cases, without limitation to a stacked-layer structure formed of the same material, a stacked-layer structure formed of different materials may be employed.

The oxide layer 330 preferably has a stacked-layer structure using oxides with different chemical compositions. Specifically, the atomic ratio of the element M to the metal elements of the main components in the metal oxide used for the oxide layer 330*a* is preferably greater than that in the metal oxide used for the oxide layer 330*b*. The atomic ratio of the element M to In in the metal oxide used for the oxide layer 330*a* is preferably greater than that in the metal oxide used for the oxide layer 330*b*. The atomic ratio of In to the element Min the metal oxide used for the oxide layer 330*b* is preferably greater than that in the metal oxide used for the oxide layer 330*a*. A metal oxide that can be used for the oxide layer 330*a* or the oxide layer 330*b* can be used for the oxide layer 330*c*.

The oxide layer 330*b* and the oxide layer 330*c* preferably have crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide layer 330*b* by the source electrode or the drain electrode. This can reduce oxygen extraction from the oxide layer 330*b* even when heat treatment is performed; thus, the transistor 300 is stable with respect to high temperatures in a manufacturing process (what is called thermal budget).

A CAAC-OS is preferably used for the oxide layer 330*c*; the c-axes of crystals included in the oxide layer 330*c* are preferably aligned in a direction substantially perpendicular to the formation surface or the top surface of the oxide layer 330*c*. The CAAC-OS has a property of making oxygen move easily in the direction perpendicular to the c-axis. Thus, oxygen contained in the oxide layer 330*c* can be efficiently supplied to the oxide layer 330*b*.

The energy level of the conduction band minimum of each of the oxide layer 330*a* and the oxide layer 330*c* is preferably higher than that of the oxide layer 330*b*. In other words, the electron affinity of each of the oxide layer 330*a* and the oxide layer 330*c* is preferably smaller than that of the oxide layer 330*b*. In that case, a metal oxide that can be used for the oxide layer 330*a* is preferably used for the oxide layer 330*c*. At this time, the oxide layer 330*b* serves as a main carrier path.

Here, the energy level of the conduction band minimum is gradually varied at junction portions of the oxide layer 330*a*, the oxide layer 330*b*, and the oxide layer 330*c*. In other words, the energy level of the conduction band minimum at the junction portions of the oxide layer 330*a*, the oxide layer 330*b*, and the oxide layer 330*c* is continuously varied or continuously connected. This can be achieved by decrease in the density of defect states in a mixed layer formed at the interface between the oxide layer 330*a* and the oxide layer 330*b* and the interface between the oxide layer 330*b* and the oxide layer 330*c*.

Specifically, when the oxide layer 330*a* and the oxide layer 330*b* or the oxide layer 330*b* and the oxide layer 330*c* contain the same element as a main component in addition to oxygen, a mixed layer with a low density of defect states can be formed. For example, in the case where the oxide layer 330*b* is an In—Ga—Zn oxide, an In—Ga—Zn oxide, a Ga—Zn oxide, gallium oxide, or the like may be used for the oxide layer 330*a* and the oxide layer 330*c*.

Specifically, for the oxide layer 330*a*, a metal oxide with In:Ga:Zn=1:3:4 [atomic ratio] or 1:1:0.5 [atomic ratio] is used. For the oxide layer 330*b*, a metal oxide with In:Ga:Zn=1:1:1 [atomic ratio] or In:Ga:Zn=4:2:3 [atomic ratio] is used. For the oxide layer 330*c*, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used.

When the metal oxide is deposited by a sputtering method, the above atomic ratio is not limited to the atomic ratio of the deposited metal oxide and may be the atomic ratio of a sputtering target used for depositing the metal oxide.

When the oxide layer 330*a* and the oxide layer 330*c* have the above structure, the density of defect states at the interface between the oxide layer 330*a* and the oxide layer 330*b* and the interface between the oxide layer 330*b* and the oxide layer 330*c* can be made low. This reduces the influence of interface scattering on carrier conduction, and the transistor 300 can have a high on-state current and high frequency characteristics.

The oxide layer 330*c* may have a stacked-layer structure of two or more layers. For example, the oxide layer 330*c* may include a first oxide layer and a second oxide over the first oxide layer.

The first oxide layer of the oxide layer 330*c* preferably contains at least one of the metal elements contained in the metal oxide used for the oxide layer 330*b*, and further preferably contains all of these metal elements. For example, it is preferable that an In—Ga—Zn oxide film be used as the first oxide layer of the oxide layer 330*c*, and an In—Ga—Zn oxide film, a Ga—Zn oxide film, or a gallium oxide film be used as the second oxide layer of the oxide layer 330*c*. Thus, the density of defect states at the interface between the oxide layer 330*b* and the first oxide layer of the oxide layer 330*c* can be decreased. The second oxide layer of the oxide layer 330*c* preferably inhibits diffusion or transmission of oxygen more than the first oxide layer of the oxide layer 330*c*. Providing the second oxide layer of the oxide layer 330*c* between the insulating layer 350 and the first oxide layer of the oxide layer 330*c* can inhibit diffusion of oxygen contained in the insulating layer 380 into the insulating layer 350. Consequently, the oxygen is more likely to be supplied to the oxide layer 330*b* through the first oxide layer of the oxide layer 330*c*.

The energy level of the conduction band minimum of each of the oxide layer 330*a* and the second oxide layer of the oxide layer 330*c* is preferably higher than the energy level of the conduction band minimum of each of the oxide layer 330*b* and the first oxide layer of the oxide layer 330*c*. In other words, the electron affinity of each of the oxide layer 330*a* and the second oxide layer of the oxide layer 330*c* is preferably smaller than the electron affinity of each of the oxide layer 330*b* and the first oxide layer of the oxide layer 330*c*. In that case, it is preferable that a metal oxide that can be used for the oxide layer 330*a* be used for the second oxide layer of the oxide layer 330*c*, and a metal oxide that can be used for the oxide layer 330*b* be used for the first oxide layer of the oxide layer 330*c*. At this time, not only the oxide layer 330*b* but also the first oxide layer of the oxide layer 330*c* serves as a main carrier path in some cases.

For the conductive layer 342, $TaN_xO_y$ described above is preferably used. Note that $TaN_xO_y$ may contain aluminum. As another example, titanium nitride, a nitride containing titanium and aluminum, ruthenium oxide, an oxide containing strontium and ruthenium, or an oxide containing lanthanum and nickel may be used. These materials are preferable because they are conductive materials that are not easily oxidized or materials that maintain the conductivity even when absorbing oxygen.

The insulating layer 354 is preferably partly in contact with the top surface and side surface of the conductive layer 342*a*, the top surface and side surface of the conductive layer 342*b*, the side surfaces of the oxide layer 330*a* and the oxide layer 330*b*, and the top surface of the insulating layer 324, as illustrated in FIG. 8(B). With such a structure, the insulating layer 380 is isolated from the insulating layer 324, the oxide layer 330*a*, and the oxide layer 330*b* by the insulating layer 354.

Like the insulating layer 322, the insulating layer 354 preferably has a function of inhibiting diffusion of one or both of hydrogen and oxygen. For example, the insulating layer 354 preferably has a function of inhibiting diffusion of one or both of hydrogen and oxygen more than the insulating layer 324 and the insulating layer 380. Thus, diffusion of hydrogen contained in the insulating layer 380 into the oxide layer 330*a* and the oxide layer 330*b* can be inhibited. Furthermore, by surrounding the insulating layer 324, the oxide layer 330, and the like with the insulating layer 322 and the insulating layer 354, diffusion of impurities such as water and hydrogen into the insulating layer 324 and the oxide layer 330 from the outside can be inhibited. Consequently, the transistor 300 can have favorable electrical characteristics and reliability.

An insulating film containing an oxide of one or both of aluminum and hafnium is preferably formed as the insulating layer 354, for example. In this case, the insulating layer 354 is preferably formed using an atomic layer deposition (ALD) method. An ALD method is a deposition method that provides good coverage, and thus can prevent formation of disconnection or the like due to unevenness of the insulating layer 354.

An insulating film containing aluminum nitride is preferably used as the insulating layer 354, for example. In that case, the insulating layer 354 can be a film having an excellent insulating property and high thermal conductivity, and thus dissipation of heat generated in driving the transistor 300 can be increased. Alternatively, silicon nitride, silicon nitride oxide, or the like can be used.

An oxide containing gallium may be used for the insulating layer 354, for example. An oxide containing gallium is preferable because it sometimes has a function of inhibiting diffusion of one or both of hydrogen and oxygen. Note that gallium oxide, gallium zinc oxide, indium gallium zinc oxide, or the like can be used as an oxide containing gallium. Note that when an indium gallium zinc oxide film is used as the insulating layer 354, the atomic ratio of gallium to indium is preferably large. A large atomic ratio of gallium to indium can improve the insulating property of the oxide film.

The insulating layer 350 functions as a gate insulating layer. The insulating layer 350 is preferably placed in contact with the top surface of the oxide layer 330*c*. As the material for the insulating layer 350, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride are preferable because they are thermally stable.

Like the insulating layer 324, the insulating layer 350 is preferably formed using an insulating film from which oxygen is released by heating. When an insulating film from which oxygen is released by heating is provided in contact with the top surface of the oxide layer 330*c* as the insulating layer 350, oxygen can be effectively supplied to the channel formation region of the oxide layer 330*b* and oxygen defects in the channel formation region of the oxide layer 330*b* can be reduced. Thus, a transistor that has stable electrical characteristics with a small variation in electrical characteristics and improved reliability can be provided. Furthermore, as in the insulating layer 324, the concentration of impurities such as water and hydrogen in the insulating layer 350 is preferably reduced. The thickness of the insulating layer 350 is preferably greater than or equal to 1 nm and less than or equal to 20 nm.

The conductive layer 360 preferably includes the conductive layer 360*a* and the conductive layer 360*b* over the conductive layer 360*a*. For example, the conductive layer 360*a* is preferably positioned so as to cover the bottom surface and side surface of the conductive layer 360*b*.

For the conductive layer 360*a*, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

When the conductive layer 360*a* has a function of inhibiting oxygen diffusion, it is possible to inhibit a reduction in conductivity of the conductive layer 360*b* due to oxidation caused by oxygen contained in the insulating layer 350. As a conductive material having a function of inhibiting oxygen diffusion, tantalum, tantalum nitride, ruthenium, or ruthenium oxide is preferably used, for example.

The conductive layer 360 also functions as a wiring and thus a conductive material having high conductivity is preferably used. For example, for the conductive layer 360*b*, a conductive material containing tungsten, copper, or aluminum as its main component can be used. The conductive layer 360*b* may have a stacked-layer structure, for example, a stacked layer structure of a titanium film or a titanium nitride film and a film containing any of the above conductive materials.

Although the conductive layer 360 has a two-layer structure of the conductive layer 360*a* and the conductive layer 360*b* in FIG. 8, the conductive layer 360 may have a single-layer structure or a stacked-layer structure of three or more layers.

In the transistor 300, the conductive layer 360 is formed in a self-aligned manner so as to fill an opening formed in the insulating layer 380 and the like. Forming the conductive layer 360 in this manner allows the conductive layer 360 to be surely positioned in a region between the conductive layer 342*a* and the conductive layer 342*b* without alignment.

As illustrated in FIG. 8(B), the top surface of the conductive layer 360 is substantially aligned with the top surface of the insulating layer 350 and the top surface of the oxide layer 330*c*.

As illustrated in FIG. 8(C), in the channel width direction of the transistor 300, with reference to the bottom surface of the insulating layer 322, the level of the bottom surface of the conductive layer 360 in a region where the conductive layer 360 and the oxide layer 330*b* do not overlap with each other is preferably lower than the level of the bottom surface of the oxide layer 330*b*. When the conductive layer 360 functioning as the gate electrode covers the side surface and top surface of the channel formation region of the oxide layer 330*b* with the insulating layer 350 and the like therebetween, the electric field of the conductive layer 360 is likely to affect the entire channel formation region of the oxide layer 330*b*. Thus, the on-state current of the transistor

300 can be increased and the frequency characteristics of the transistor 300 can be improved.

The insulating layer 380 is provided over the insulating layer 324, the oxide layer 330, and the conductive layer 342 with the insulating layer 354 therebetween. The top surface of the insulating layer 380 may be planarized.

The insulating layer 380 functioning as the interlayer film preferably has a low dielectric constant. When a material with a low dielectric constant is used for the interlayer film, the parasitic capacitance generated between wirings can be reduced. The insulating layer 380 is preferably formed using a material similar to that for the insulating layer 316, for example. Silicon oxide and silicon oxynitride are particularly preferable in terms of high thermal stability. Materials such as silicon oxide, silicon oxynitride, and porous silicon oxide, in each of which a region containing oxygen released by heating can be easily formed, are particularly preferable.

The concentration of impurities such as water and hydrogen in the insulating layer 380 is preferably reduced. Moreover, the insulating layer 380 preferably has a low hydrogen concentration and includes an excess-oxygen region or excess oxygen, and may be formed using a material similar to that for the insulating layer 316, for example. Note that the insulating layer 380 may have a stacked-layer structure of two or more layers.

Like the insulating layer 314 and the like, the insulating layer 374 preferably functions as an insulating barrier film that inhibits diffusion of impurities such as water and hydrogen into the insulating layer 380 from above. In addition, like the insulating layer 314 and the like, the insulating layer 374 preferably has a low hydrogen concentration and has a function of inhibiting diffusion of hydrogen.

The insulating layer 374 is preferably in contact with the top surfaces of the conductive layer 360, the insulating layer 350, and the oxide layer 330*c*, as illustrated in FIG. 8(B). In that case, impurities such as hydrogen contained in the insulating layer 381 and the like can be inhibited from entering the insulating layer 350. Thus, adverse effects on the electrical characteristics of the transistor and the reliability of the transistor can be suppressed.

The insulating layer 381 functioning as the interlayer film is preferably provided over the insulating layer 374. Like the insulating layer 316 and the like, the insulating layer 381 preferably has a low dielectric constant. As in the insulating layer 324 and the like, the concentration of impurities such as water and hydrogen in the insulating layer 381 is preferably reduced.

The conductive layer 340*a* and the conductive layer 340*b* are located in openings formed in the insulating layer 381, the insulating layer 374, the insulating layer 380, and the insulating layer 354. The conductive layer 340*a* and the conductive layer 340*h* are provided to face each other with the conductive layer 360 positioned therebetween. Note that the top surfaces of the conductive layer 340*a* and the conductive layer 340*b* may be level with the top surface of the insulating layer 381.

The insulating layer 341*a* is provided in contact with a side wall of the opening in the insulating layer 381, the insulating layer 374, the insulating layer 380, and the insulating layer 354, and the conductive layer 340*a* is formed in contact with the side surface of the insulating layer 341*a*. The conductive layer 342*a* is located on at least part of the bottom portion of the opening, and the conductive layer 340*a* is in contact with the conductive layer 342*a*. Similarly, the insulating layer 341*b* is provided in contact with a side wall of the opening in the insulating layer 381, the insulating layer 374, the insulating layer 380, and the insulating layer 354, and the conductive layer 340*b* is formed in contact with the side surface of the insulating layer 341*b*. The conductive layer 342*b* is located on at least part of the bottom portion of the opening, and the conductive layer 340*b* is in contact with the conductive layer 342*b*.

For the conductive layer 340*a* and the conductive layer 340*b*, a conductive material containing tungsten, copper, or aluminum as its main component is preferably used.

The conductive layer 340*a* and the conductive layer 340*b* may have a stacked-layer structure. Although an example is shown in which the conductive layer 340*a* and the conductive layer 340*h* in the transistor 300 have a stacked-layer structure of two layers, the present invention is not limited thereto. For example, the conductive layer 340 may have a single-layer structure or a stacked-layer structure of three or more layers.

As the insulating layer 341*a* and the insulating layer 341*b*,an insulating film that can be used as the insulating layer 314, the insulating layer 354, or the like can be used, for example. Since the insulating layer 341*a* and the insulating layer 341*b* are provided in contact with the insulating layer 354, impurities such as water and hydrogen contained in the insulating layer 380 and the like can be inhibited from diffusing into the oxide layer 330 through the conductive layer 340*a* and the conductive layer 340*b*. In addition, oxygen contained in the insulating layer 380 can be prevented from being absorbed by the conductive layer 340*a* and the conductive layer 340*b*.

Although not illustrated, a conductive layer functioning as a wiring may be provided in contact with the top surface of the conductive layer 340*a* and the top surface of the conductive layer 340*b*. For the conductive layer functioning as a wiring, a conductive material containing tungsten, copper, or aluminum as its main component is preferably used. Furthermore, the conductive layer may have a stacked-layer structure; for example, a stacked-layer structure of a titanium film or a titanium nitride film and a film containing the above conductive material. Note that the conductive layer may be formed to be embedded in an opening provided in an insulating layer.

Although not illustrated, an insulating layer having a resistivity higher than or equal to $1.0\times10^{13}$ Ωcm and lower than or equal to 1.0×10 Ωcm, preferably higher than or equal to $5.0\times10^{13}$ Ωcm and lower than or equal to $5.0\times10^{14}$ Ωcm is preferably provided to cover the conductive layer. It is preferable that an insulating layer having a resistivity in the above range be provided over the conductive layer, in which case the insulating layer can disperse electric charge accumulated in the transistor 300 or between wirings of the conductive layer and the like and can inhibit defects in characteristics and electrostatic breakdown of the transistor and an electronic device including the transistor due to the electric charge, while maintaining the insulating property.

As described above, in the display device of this embodiment, a plurality of light-emitting diodes and a plurality of transistors can be attached to each other at a time, resulting in a reduction in manufacturing cost and an improvement in yield of the display device. Moreover, combining a micro LED and a transistor using a metal oxide can achieve a display device with reduced power consumption.

The size of the transistors can be small in the display device of this embodiment, which facilitates an increase in the resolution and the application to an electronic device having a relatively small display portion.

This embodiment can be combined with the other embodiments as appropriate. In this specification, in the case where a plurality of structure examples are shown in one embodiment, the structure examples can be combined as appropriate.

Embodiment 2

In this embodiment, a pixel in the display device of one embodiment of the present invention will be described with reference to FIG. 10.

[Pixel]

A display device of this embodiment includes a plurality of pixels arranged in a matrix of m rows and n columns (m and n are each an integer of 1 or more). FIG. 10 illustrates an example of a circuit diagram of a pixel 200(*i,j*) (i is an integer of 1 or more and m or less, and j is an integer of 1 or more and n or less).

Figure 10:
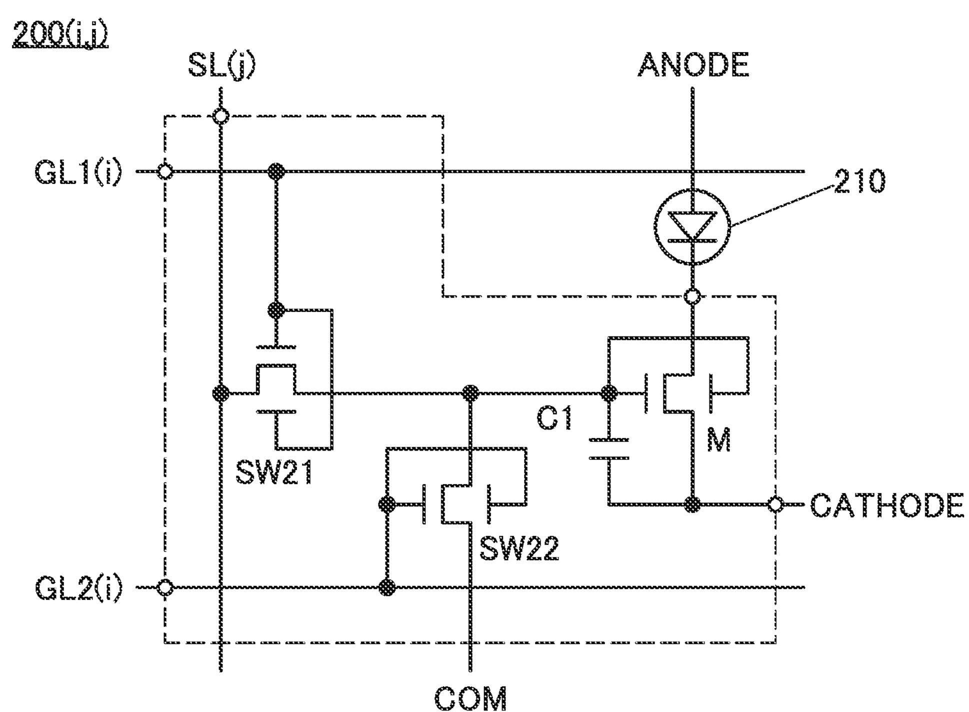
FIG. 10 is a circuit diagram illustrating an example of a pixel in a display device.

The pixel 200(*i,j*) illustrated in FIG. 10 includes a light-emitting element 210, a switch SW21, a switch SW22, a transistor M, and a capacitor C1.

This embodiment shows an example where a transistor is used as the switch SW21. A gate of the switch SW21 is electrically connected to a scan line GL1(*i*). One of a source and a drain of the switch SW21 is electrically connected to a signal line SL(j), and the other is electrically connected to a gate of the transistor M.

This embodiment shows an example where a transistor is used as the switch SW22. A gate of the switch SW22 is electrically connected to a scan line GL2(*i*). One of a source and a drain of the switch SW22 is electrically connected to a wiring COM, and the other is electrically connected to the gate of the transistor M.

The gate of the transistor M is electrically connected to one electrode of the capacitor C1, the other of the source and the drain of the switch SW21, and the other of the source and the drain of the switch SW22. One of a source and a drain of the transistor M is electrically connected to a wiring CATHODE, and the other is electrically connected to a cathode of the light-emitting element 210.

The other electrode of the capacitor C1 is electrically connected to the wiring CATHODE.

An anode of the light-emitting element 210 is electrically connected to a wiring ANODE.

The scan line GL1(*i*) has a function of supplying a selection signal. The scan line GL2(*i*) has a function of supplying a control signal. The signal line SL(j) has a function of supplying an image signal. A constant potential is supplied to each of the wiring VCOM, the wiring CATHODE, and the wiring ANODE. In the light-emitting element 210, the anode side can have a high potential and the cathode side can have a lower potential than the anode side.

The switch SW21 is controlled by a selection signal and functions as a selection transistor for controlling the selection state of the pixel 200.

The transistor M functions as a driving transistor that controls a current flowing through the light-emitting element 210 in accordance with a potential supplied to the gate. When the switch SW21 is on, an image signal supplied to the signal line SL(j) is supplied to the gate of the transistor M, and the luminance of the light-emitting element 210 can be controlled in accordance with the potential.

The switch SW22 has a function of controlling the gate potential of the transistor Mon the basis of a control signal. Specifically, the switch SW22 can supply a potential for turning off the transistor M to the gate of the transistor M.

The switch SW22 can be used to control the pulse width, for example. During a period based on a control signal, a current can be supplied from the transistor M to the light-emitting element 210. Alternatively, the light-emitting element 210 can express a gray level on the basis of an image signal and a control signal.

Here, as each of the transistors included in the pixel 200(*i,j*), it is preferable to use a transistor in which a metal oxide (an oxide semiconductor) is used for a semiconductor layer where a channel is formed.

A transistor using a metal oxide having a wider band gap and a lower carrier density than silicon can achieve an extremely low off-state current. Thus, such a low off-state current enables long-term retention of electric charge accumulated in a capacitor that is connected in series with the transistor. For that reason, a transistor including an oxide semiconductor is preferably used particularly as the switch SW21 and the switch SW22, each of which is connected in series with the capacitor C1. Moreover, the use of a transistor including an oxide semiconductor as the other transistor can reduce the manufacturing cost.

Alternatively, a transistor including silicon as a semiconductor in which a channel is formed can be used as the transistor included in the pixel 200(*i,j*). In particular, the use of silicon with high crystallinity, such as single crystal silicon or polycrystalline silicon, is preferable, in which case high field-effect mobility is achieved and higher-speed operation is possible.

Alternatively, a transistor including an oxide semiconductor may be used as at least one transistor included in the pixel 200(*i,j*), and a transistor including silicon may be used as the other transistors.

Although n-channel transistors are shown as the transistors in FIG. 10, p-channel transistors can also be used.

[Transistor]

Next, transistors that can be used in the display device are described.

There is no particular limitation on the structure of the transistor included in the display device. For example, a planar transistor may be employed, a staggered transistor may be employed, or an inverted staggered transistor may be employed. A top-gate transistor or a bottom-gate transistor may be used. Alternatively, gate electrodes may be provided above and below a channel.

As the transistor included in the display device, a transistor using a metal oxide in a channel formation region can be used, for example. Thus, a transistor with an extremely low off-state current can be obtained.

Alternatively, as the transistor included in the display device, a transistor containing silicon in a channel formation region may be used. Examples of the transistor include a transistor containing amorphous silicon, a transistor containing crystalline silicon (typically, low-temperature polysilicon), and a transistor containing single crystal silicon.

[Metal Oxide]

A metal oxide that can be used in the semiconductor layer of the transistor will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used in the semiconductor layer.

Note that the terms "CAAC" (c-axis aligned crystal) and "CAC" (Cloud-Aligned Composite) appear in this specification and the like. Note that CAAC refers to an example of a crystal structure, and CAC refers to an example of a function or a material composition.

For example, a CAC (Cloud-Aligned Composite)-OS can be used for the semiconductor layer.

A CAC-OS or a CAC-metal oxide has a conducting function in part of the material and has an insulating function in another part of the material; as a whole, the CAC-OS or the CAC-metal oxide has a function of a semiconductor. In the case where the CAC-OS or the CAC-metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are sometimes observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. When carriers flow in this composition, carriers mainly flow in the component having a narrow gap. Furthermore, the component having a narrow gap complements the component having a wide gap, and carriers also flow in the component having a wide gap in conjunction with the component having a narrow gap. Thus, in the case where the above-described CAC-OS or CAC-metal oxide is used in a channel formation region of a transistor, high current driving capability in an on state of the transistor, that is, a high on-state current and high field-effect mobility can be obtained.

In other words, the CAC-OS or the CAC-metal oxide can also be referred to as a matrix composite or a metal matrix composite.

Oxide semiconductors (metal oxides) are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element Min the (M,Zn) layer is replaced with indium, the layer can also be referred to as an (In,M,Zn) layer. When indium in the In layer is replaced with the element M, the layer can be referred to as an (In,M) layer.

The CAAC-OS is a metal oxide with high crystallinity Meanwhile, in the CAAC-OS, a reduction in electron mobility due to the crystal grain boundary is less likely to occur because it is difficult to observe a clear crystal grain boundary. Entry of impurities, formation of defects, or the like might decrease the crystallinity of a metal oxide; hence, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor depending on the analysis method.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, IGZO formed of smaller crystals (e.g., the above-described nanocrystals) rather than larger crystals (here, crystals with a size of several millimeters or several centimeters) may have a more stable structure.

An alike OS is a metal oxide having a structure between those of the nc-OS and an amorphous oxide semiconductor. The a-like OS includes a void or a low-density region. That is, the alike OS has low crystallinity as compared with the nc-OS and the CAAC-OS.

An oxide semiconductor (a metal oxide) can have various structures that show different properties. An oxide semiconductor of one embodiment of the present invention may include two or more of an amorphous oxide semiconductor, a polycrystalline oxide semiconductor, the a-like OS, the nc-OS, and the CAAC-OS.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

This embodiment can be combined with the other embodiments as appropriate.

Embodiment 3

In this embodiment, electronic devices of embodiments of the present invention will be described with reference to FIG. 11 to FIG. 15.

An electronic device of this embodiment includes the display device of one embodiment of the present invention in its display portion. The display device of one embodiment of the present invention has high display quality and low power consumption. In addition, the display device of one embodiment of the present invention can be easily increased in resolution and size. Thus, the display device of one embodiment of the present invention can be used for a display portion of a variety of electronic devices.

Examples of electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

In particular, the display device of one embodiment of the present invention can have high resolution, and thus can be suitably used for an electronic device having a relatively small display portion. The display device of one embodiment of the present invention can be suitably used for such an electronic device, for example, watch-type and bracelet-type information terminal devices (wearable devices) and head-worn wearable devices such as a VR device, such as a head-mounted display, a glasses type AR device, and an MR device.

The electronic device of this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device of this embodiment can have a variety of functions. For example, the electronic device of this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 11A:
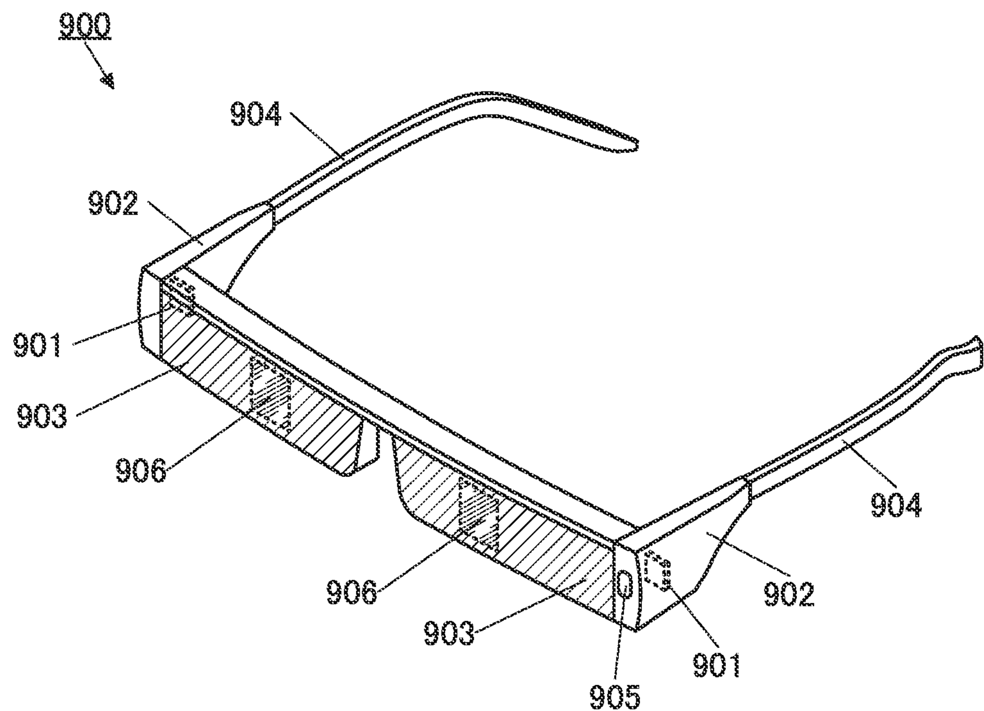
FIG. 11(A) and FIG. 11(B) are diagrams illustrating an example of an electronic device.

FIG. 11(A) is a perspective view of a glasses-type electronic device 900. The electronic device 900 includes a pair of display panels 901, a pair of housings 902, a pair of optical members 903, a pair of mounting portions 904, and the like.

The electronic device 900 can project an image displayed on the display panel 901 onto a display region 906 of the optical member 903. Since the optical members 903 have a light-transmitting property, a user can see images displayed on the display regions 906, which are superimposed on transmission images seen through the optical members 903. Thus, the electronic device 900 is an electronic device capable of AR display.

The display panel 901 included in the electronic device 900 preferably has a function of capturing an image in addition to a function of displaying an image. In that case, the electronic device 900 can receive light incident on the display panel 901 through the optical member 903, and convert the light into an electric signal to be output. Thus, an image of the user's eye or the eye and its vicinity can be captured and the image can be output to the outside or an arithmetic unit included in the electronic device 900 as image data.

One housing 902 is provided with a camera 905 capable of capturing an image of what lies ahead. Although not illustrated, one of the housings 902 is provided with a wireless receiver or a connector to which a cable can be connected, whereby a video signal or the like can be supplied to the housing 902. When the housing 902 is provided with an acceleration sensor such as a gyroscope sensor, the orientation of the user's head can be detected and an image corresponding to the orientation can be displayed on the display region 906. The housing 902 is preferably provided with a battery, and the battery is preferably capable of being charged in a wired or wireless manner.

Figure 11B:
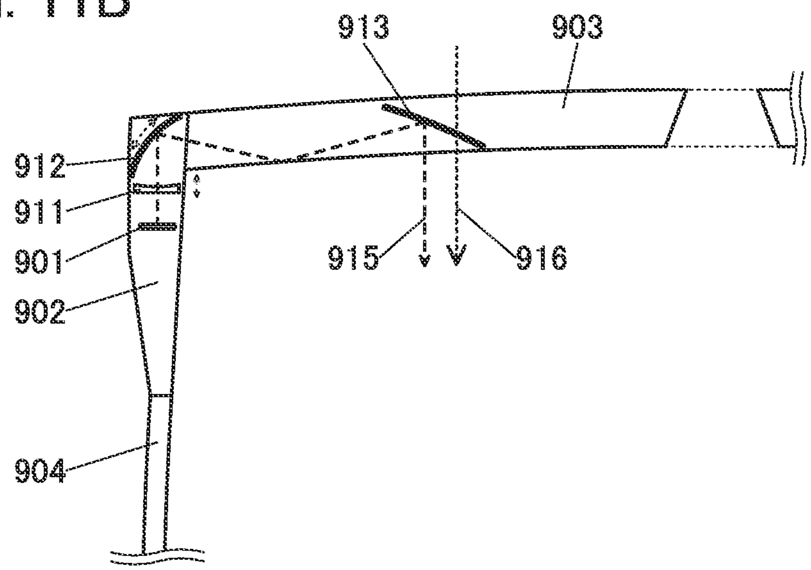

A method of projecting an image on the display region 906 of the electronic device 900 is described with reference to FIG. 11(B). The display panel 901, a lens 911, and a reflective plate 912 are provided in the housing 902. A reflective surface 913 functioning as a half mirror is provided in a portion corresponding to the display region 906 of the optical member 903.

Light 915 emitted from the display panel 901 passes through the lens 911 and is reflected by the reflective plate 912 toward the optical member 903. In the optical member 903, the light 915 is fully reflected repeatedly by end surfaces of the optical member 903 and reaches the reflective surface 913, whereby an image is projected on the reflective surface 913. Accordingly, the user can see both the light 915 reflected by the reflective surface 913 and transmitted light 916 that passes through the optical member 903 (including the reflective surface 913).

FIG. 11 illustrates an example in which the reflective plate 912 and the reflective surface 913 each have a curved surface. This can increase optical design flexibility and reduce the thickness of the optical member 903, compared to the case where they are flat. Note that the reflective plate 912 and the reflective surface 913 may be flat.

The reflective plate 912 can be a component having a mirror surface and preferably has high reflectivity. As the reflective surface 913, a half mirror utilizing reflection of a metal film may be used, but the use of a prism utilizing total reflection or the like can increase the transmittance of the transmitted light 916.

Here, the electronic device 900 preferably includes a mechanism for adjusting one or both of the distance and the angle between the lens 911 and the display panel 901. This enables focus adjustment, zooming in/out of an image, or the like. One or both of the lens 911 and the display panel 901 is configured to be movable in the optical-axis direction, for example.

The electronic device 900 preferably includes a mechanism capable of adjusting the angle of the reflective plate 912. The position of the display region 906 where images are displayed can be changed by changing the angle of the reflective plate 912. Thus, the display region 906 can be placed at the optimal position in accordance with the position of the user's eye.

The display device of one embodiment of the present invention can be used for the display panel 901. Thus, the electronic device 900 can perform display with extremely high resolution.

Figure 12A:
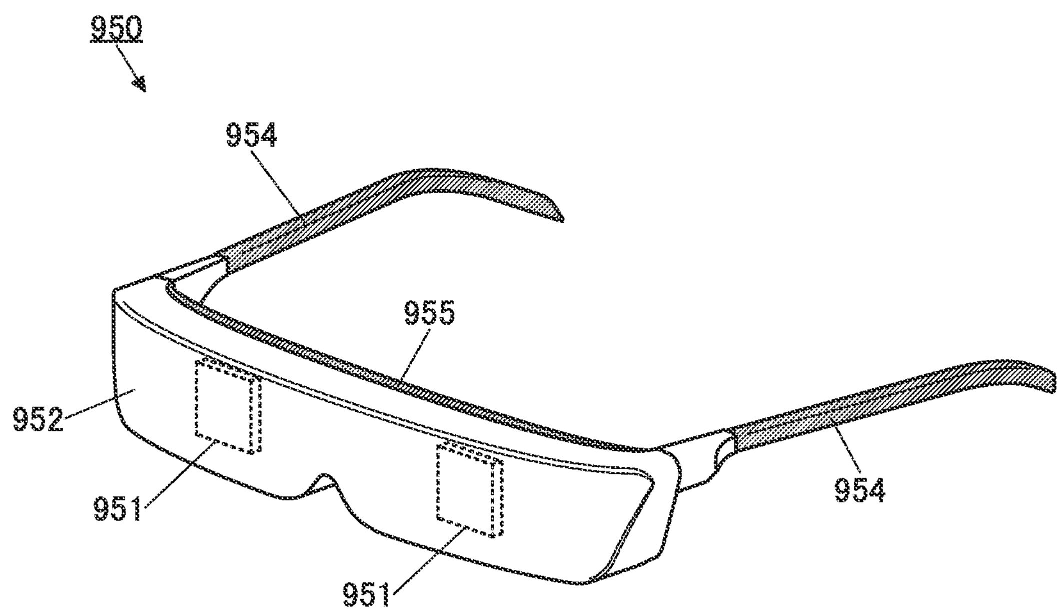
FIG. 12(A) and FIG. 12(B) are diagrams illustrating an example of an electronic device.
Figure 12B:
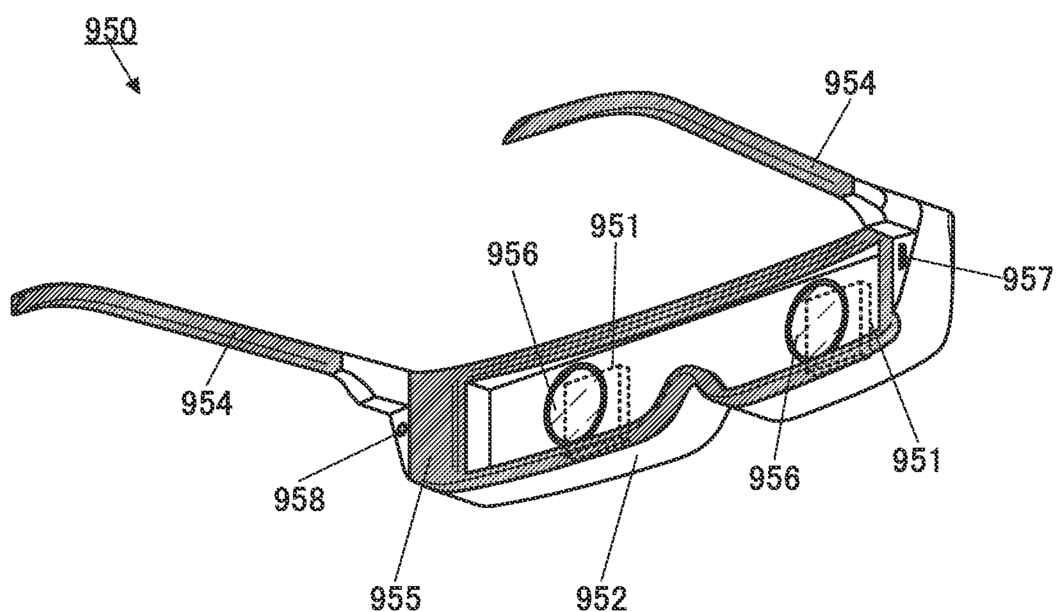

FIG. 12(A) and FIG. 12(B) are perspective views of a goggle-type electronic device 950. FIG. 12(A) is a perspective view illustrating the front surface, the top surface, and the left side surface of the electronic device 950, and FIG. 12(B) is a perspective view illustrating the back surface, the bottom surface, and the right side surface of the electronic device 950.

The electronic device 950 includes a pair of display panels 951, a housing 952, a pair of mounting portions 954, a cushion 955, a pair of lenses 956, and the like. The pair of display panels 951 are positioned to be seen through the lenses 956 inside the housing 952.

The electronic device 950 is an electronic device for VR. A user wearing the electronic device 950 can see an image displayed on the display panels 951 through the lenses 956. When the pair of display panels 951 display different images, three-dimensional display using parallax can be performed.

An input terminal 957 and an output terminal 958 are provided on the back surface side of the housing 952. To the input terminal 957, a cable for supplying a video signal from a video output device or the like, power for charging a battery provided in the housing 952, or the like can be connected. The output terminal 958 can function as, for example, an audio output terminal to which earphones, headphones, or the like can be connected. Note that in the case where audio data can be output by wireless communication or sound is output from an external video output device, the audio output terminal is not necessarily provided.

The electronic device 900 preferably includes a mechanism capable of adjusting the left and right positions of the lenses 956 and the display panels 951 to the optimal positions in accordance with the positions of the user's eyes, and preferably includes a mechanism for adjusting focus by changing the distance between the lens 956 and the display panel 951.

The display device of one embodiment of the present invention can be used for the display panel 951. Thus, the electronic device 950 can perform display with extremely high resolution. This enables the user to have a strong sense of immersion.

The cushion 955 is a portion in contact with the user's face (forehead, cheek, or the like). The cushion 955 is in close contact with the user's face, so that light leakage can be prevented, which further increases the sense of immersion. A soft material is preferably used for the cushion 955 so that the cushion 955 is in close contact with the user's face when the user wears the electronic device 950. For example, a material such as rubber, silicone rubber, urethane, or sponge can be used. Furthermore, when a sponge or the like whose surface is covered with cloth, leather (natural leather or synthetic leather), or the like is used for the cushion 955, a gap is less likely to be generated between the user's face and the cushion 955, whereby light leakage can be suitably prevented. The components in contact with the user's skin, such as the cushion 955 and the mounting portion 954, are preferably detachable, in which case cleaning or replacement can be easily performed.

Figure 13A:
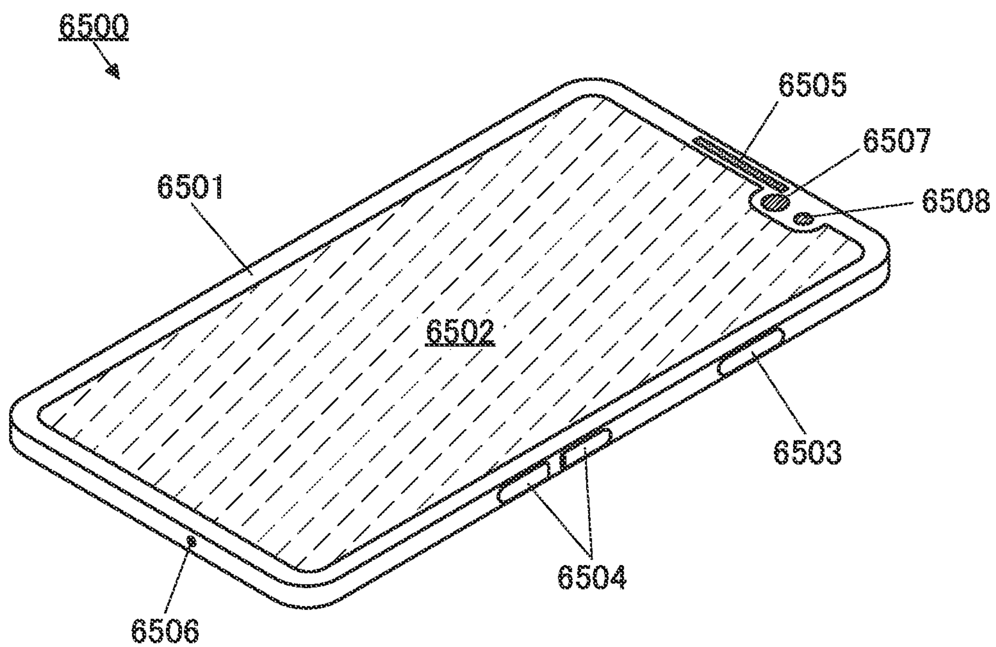
FIG. 13(A) and FIG. 13(B) are diagrams illustrating an example of an electronic device.

An electronic device 6500 illustrated in FIG. 13(A) a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

Figure 13B:
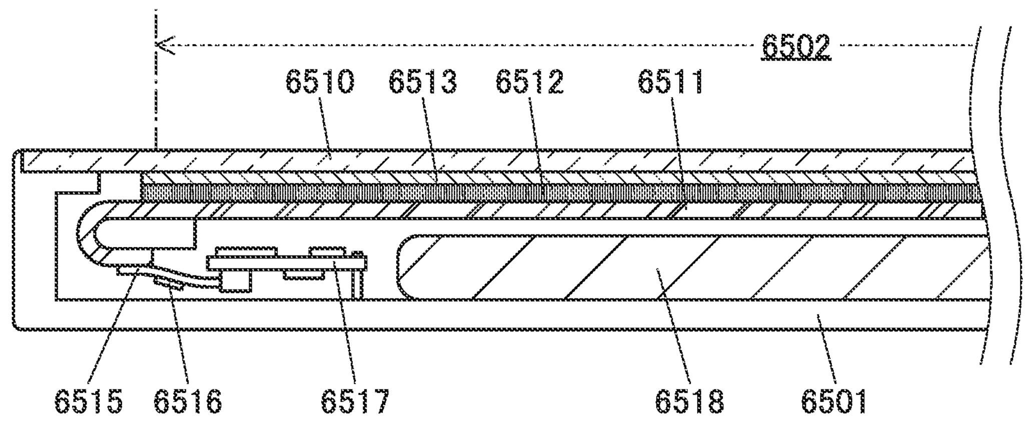

FIG. 13(B) is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 14A:
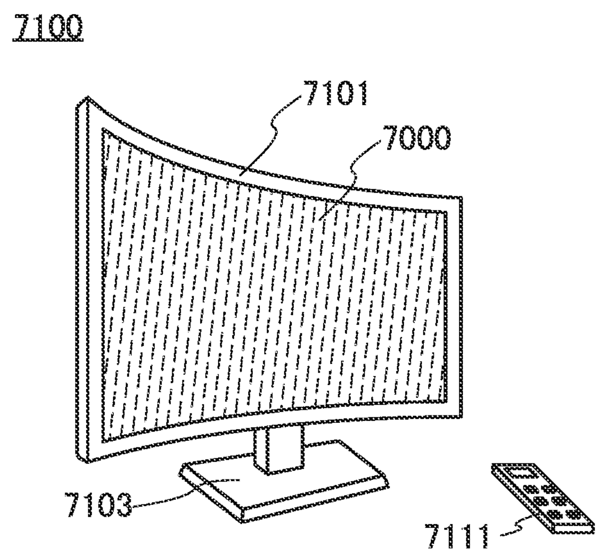
FIG. 14(A) to FIG. 14(D) are diagrams illustrating examples of electronic devices.

FIG. 14(A) illustrates an example of a television device. In a television device 7100, a display portion 7000 is incorporated in a housing 7101. Here, a structure in which the housing 7101 is supported by a stand 7103 is illustrated.

The display device of one embodiment of the present invention can be used in the display portion 7000.

Operation of the television device 7100 illustrated in FIG. 14(A) can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may include a display portion for displaying data output from the remote controller 7111. With operation keys or a touch panel provided in the remote controller 7111, channels and volume can be controlled and videos displayed on the display portion 7000 can be controlled.

Note that the television device 7100 is configured to include a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 14B:
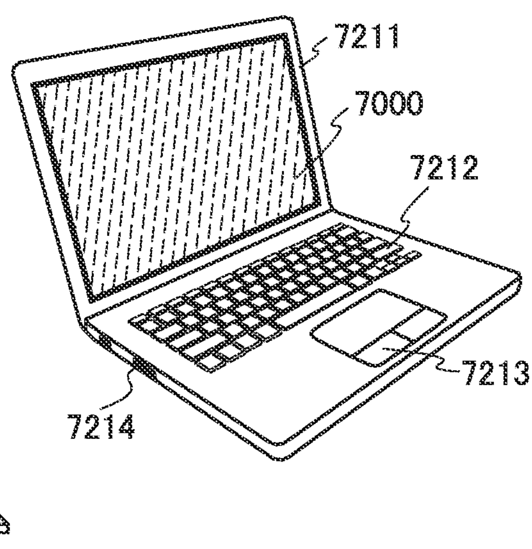

FIG. 14(B) illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display device of one embodiment of the present invention can be used in the display portion 7000.

Figure 14C:
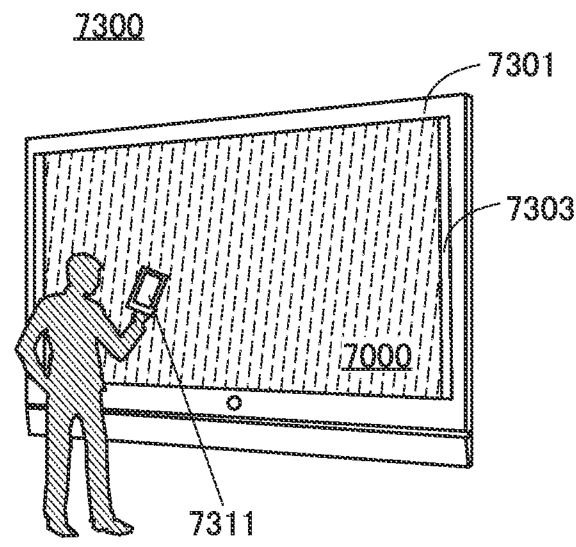
Figure 14D:
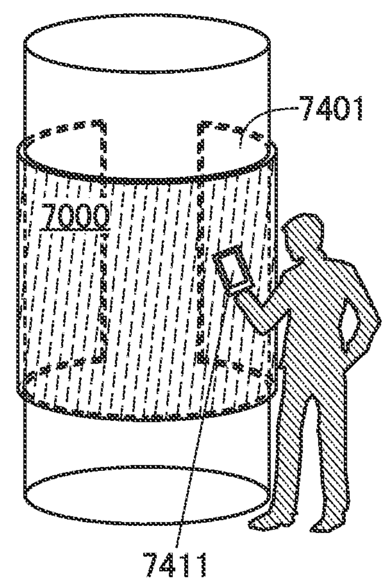

FIG. 14(C) and FIG. 14(D) illustrate examples of digital signage.

Digital signage 7300 illustrated in FIG. 14(C) includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 14(D) is digital signage 7400 attached to a cylindrical pillar 7401. The digital signage 7400 includes the display portion 7000 provided along a curved surface of the pillar 7401.

The display device of one embodiment of the present invention can be used for the display portion 7000 in FIG. 14(C) and FIG. 14(D).

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

Furthermore, as illustrated in FIG. 14(C) and FIG. 14(D), it is preferable that the digital signage 7300 or the digital signage 7400 can work with an information terminal 7311 or an information terminal 7411, such as a user's smartphone, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (a controller). Thus, an unspecified number of users can join in and enjoy the game concurrently.

Electronic devices illustrated in FIG. 15(A) to FIG. 15(F) include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 15(A) to FIG. 15(F) have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may include a camera or the like and have a function of taking a still image or a moving image and storing the taken image in a recording medium (an external recording medium or a recording medium incorporated in the camera), a function of displaying the taken image on the display portion, and the like.

The details of the electronic devices illustrated in FIG. 15(A) to FIG. 15(F) are described below.

Figure 15A:
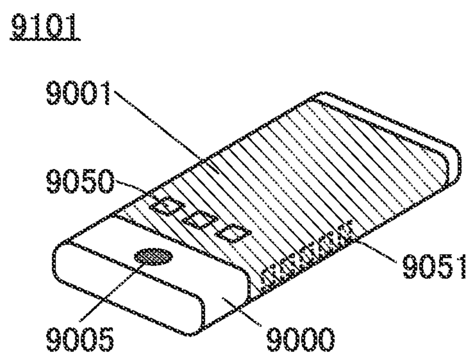
FIG. 15(A) to FIG. 15(F) are diagrams illustrating examples of electronic devices.

FIG. 15(A) is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display letters and image information on its plurality of surfaces. FIG. 15(A) illustrates an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 15C:
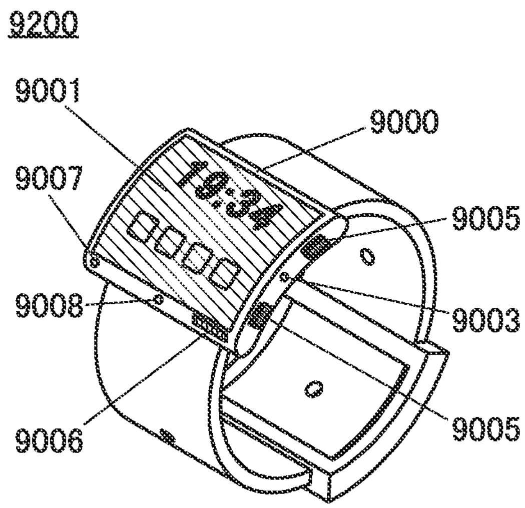
Figure 15B:
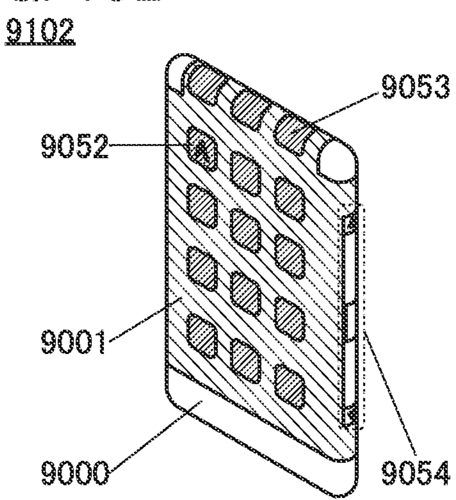

FIG. 15(B) is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 15(C) is a perspective view illustrating a watch-type portable information terminal 9200. The portable information terminal 9200 can be used as a smart watch, for example. The display surface of the display portion 9001 is curved, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 15D:
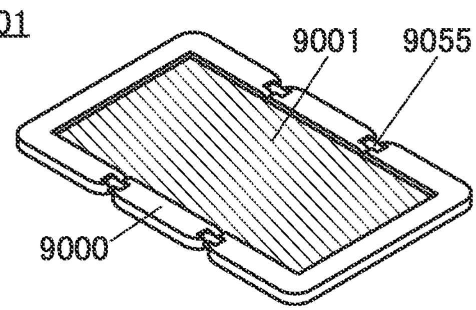
Figure 15E:
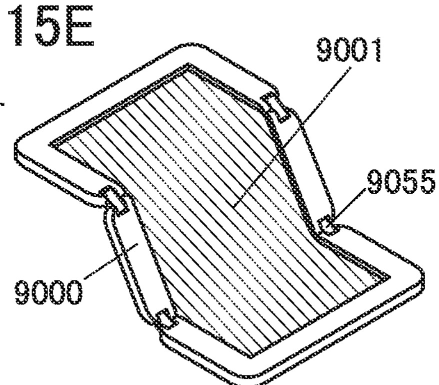
Figure 15F:
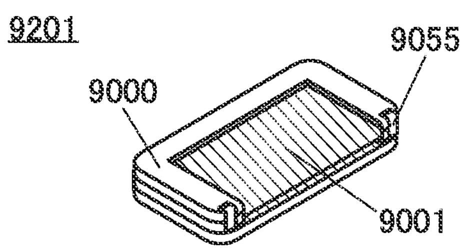

FIG. 15(D) to FIG. 15(F) are perspective views illustrating a foldable portable information terminal 9201. FIG. 15(D) is a perspective view of an opened state of the portable information terminal 9201, FIG. 15(F) is a perspective view of a folded state thereof, and FIG. 15(E) is a perspective view of a state in the middle of change from one of FIG. 15(D) and FIG. 15(F) to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with the other embodiments and examples as appropriate.

REFERENCE NUMERALS

C1: capacitor, GL1: scan line, GL2: scan line, SW21: switch, SW22: switch, 100A: display device, 100B: display device, 100C: display device, 100D: display device, 100E: display device, 100F: display device, 101: substrate, 102: protective layer, 110*a*: light-emitting diode, 110*b*: light-emitting diode, 112*a*: electrode, 112*b*: electrode, 113*a*: semiconductor layer, 113*b*: semiconductor layer, 114*a*: light-emitting layer, 114*b*: light-emitting layer, 115*a*: semiconductor layer, 115*b*: semiconductor layer, 116*a*: electrode, 116*b*: electrode, 117*a*: conductor, 117*b*: conductor, 117*c*: conductor, 117*d*: conductor, 120*a*: transistor, 120*b*: transistor, 130*a*: transistor, 130*b*: transistor, 131: substrate, 132: element isolation layer, 133: low-resistance region, 134: insulating layer, 135: conductive layer, 136: insulating layer, 137: conductive layer, 138: conductive layer, 139: insulating layer, 141: insulating layer, 142: conductive layer, 143: insulating layer, 150A: LED substrate, 1509: circuit board, 151: substrate, 152: insulating layer, 161: conductive layer, 162: insulating layer, 163: insulating layer, 164: insulating layer, 165: metal oxide layer, 166: conductive layer, 167: insulating layer, 168: conductive layer, 171: substrate, 172: wiring, 173: insulating layer, 174: electrode, 175: conductive layer, 176: connector, 177: electrode, 178: electrode, 179: adhesive layer, 181: insulating layer, 182: insulating layer, 183: insulating layer, 184*a*: conductive layer, 184*b*: conductive layer, 185: insulating layer, 186: insulating layer, 187: conductive layer, 187*a*: conductive layer, 187*b*: conductive layer, 188: insulating layer, 189: conductive layer, 189*a*: conductive layer, 189*b*: conductive layer, 190*a*: conductive layer, 190*b*: conductive layer, 190*c*: conductive layer, 190*d*: conductive layer, 190*e*: conductive layer, 191: substrate, 192: adhesive layer, 195: conductor, 200: pixel, 210: light-emitting element, 300: transistor, 300A: transistor, 305: conductive layer, 314: insulating layer, 316: insulating layer, 322: insulating layer, 324: insulating layer, 330: oxide layer, 330*a*: oxide layer, 330*b*: oxide layer, 330*c*: oxide layer, 340: conductive layer, 340*a*: conductive layer, 340*b*: conductive layer, 341: insulating layer, 341*a*: insulating layer, 341*b*: insulating layer, 342: conductive layer, 342*a*: conductive layer, 342*b*: conductive layer, 350: insulating layer, 354: insulating layer, 360: conductive layer, 360*a*: conductive layer, 360*b*: conductive layer, 374: insulating layer, 380: insulating layer, 381: insulating layer, 900: electronic device, 901: display panel, 902: housing, 903: optical member, 904: mounting portion, 905: camera, 906: display region, 911: lens, 912: reflective plate, 913: reflective surface, 915: light, 916: transmitted light, 950: electronic device, 951: display panel, 952: housing, 954: mounting portion, 955: cushion, 956: lens, 957: input terminal, 958: output terminal, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A display device comprising:

a substrate;

a plurality of light-emitting diodes over the substrate, the plurality of light-emitting diodes arranged in a matrix;

a plurality of transistors each electrically connected to at least one of the plurality of light-emitting diodes;

an insulating layer between the plurality of light-emitting diodes and the plurality of transistors; and a plurality of conductive pastes between the plurality of light-emitting diodes and the plurality of transistors, wherein one of the plurality of transistors is electrically connected to the one of the plurality of light-emitting diodes via one of the plurality of conductive pastes, wherein the plurality of light-emitting diodes is closer to the substrate than the plurality of transistors is, wherein each of the plurality of light-emitting diodes is a micro light-emitting diode, wherein an area of a light-emitting region of each of the plurality of light-emitting diodes is less than or equal to 10000 $\mu m^2$, wherein each of the plurality of transistors comprises a metal oxide layer and a gate electrode, and wherein a top surface of the gate electrode is substantially level with a top surface of the insulating layer.

2. The display device according to claim 1, wherein the plurality of light-emitting diodes comprises a first light-emitting diode and a second light-emitting diode, and wherein emission of the first light-emitting diode has a different color from emission of the second light-emitting diode.

3. The display device according to claim 2, wherein a first transistor is electrically connected to the first light-emitting diode, wherein a second transistor is electrically connected to the second light-emitting diode, and wherein the first transistor and the second transistor are different in one or both of channel length and channel width.

4. The display device according to claim 1, wherein all the plurality of light-emitting diodes is configured to emit light with an identical color.

5. The display device according to claim 1, further comprising a driver circuit, wherein the driver circuit comprises a plurality of circuit transistors, wherein each of the plurality of circuit transistors comprises a channel formation region in a semiconductor substrate, wherein the insulating layer, the plurality of transistors, and the plurality of light-emitting diodes are between the substrate and the semiconductor substrate, and wherein the plurality of transistors is closer to the substrate than the plurality of circuit transistors is.

6. The display device according to claim 1, further comprising a functional layer, wherein the functional layer is between the substrate and the one of the plurality of light-emitting diodes, wherein the one of the plurality of light-emitting diodes emits light toward the substrate through the functional layer, and wherein the functional layer comprises one or both of a coloring layer and a color conversion layer.

7. The display device according to claim 1, further comprising a touch sensor, wherein each of the plurality of light-emitting diodes is configured to emit light toward the touch sensor through the substrate.

8. A display module comprising:

the display device according to claim 1; and one of a connector and an integrated circuit electrically connected to the display device.

9. The display device according to claim 1, further comprising a color conversion layer overlapping with the one of the plurality of light-emitting diodes, wherein the color conversion layer includes a quantum dot.

10. A display device comprising:

a substrate;

an insulating layer;

a plurality of light-emitting diodes over the substrate, the plurality of light-emitting diodes arranged in a matrix;

a plurality of transistors each electrically connected to at least one of the plurality of light-emitting diodes; and a plurality of conductive pastes between the plurality of light-emitting diodes and the plurality of transistors, wherein one of the plurality of transistors is electrically connected to the one of the plurality of light-emitting diodes via one of the plurality of conductive pastes, wherein the plurality of light-emitting diodes is closer to the substrate than the plurality of transistors is, wherein each of the plurality of light-emitting diodes is a micro light-emitting diode, wherein an area of a light-emitting region of each of the plurality of light-emitting diodes is less than or equal to 10000 $\mu m^2$, wherein the plurality of light-emitting diodes is configured to emit light toward the substrate, wherein each of the plurality of transistors comprises a metal oxide layer, a gate insulating layer, a gate electrode, a first conductive layer, and a second conductive layer, wherein the metal oxide layer comprises a first region, a second region, and a third region comprising a channel formation region between the first region and the second region, wherein the first conductive layer overlaps with the first region and the second conductive layer overlaps with the second region, wherein the first conductive layer and the second conductive layer are apart from each other over the metal oxide layer, wherein the insulating layer is over the first conductive layer and the second conductive layer, wherein the insulating layer comprises an opening overlapping with the third region, wherein the gate insulating layer and the gate electrode are inside the opening, and wherein the gate electrode faces the insulating layer with the gate insulating layer therebetween and faces the third region with the gate insulating layer therebetween.

11. The display device according to claim 10, wherein the plurality of light-emitting diodes comprises a first light-emitting diode and a second light-emitting diode, and wherein emission of the first light-emitting diode has a different color from emission of the second light-emitting diode.

12. The display device according to claim 11, wherein a first transistor is electrically connected to the first light-emitting diode, wherein a second transistor is electrically connected to the second light-emitting diode, and wherein the first transistor and the second transistor are different in one or both of channel length and channel width.

13. The display device according to claim 10, wherein all the plurality of light-emitting diodes is configured to emit light with an identical color.

14. The display device according to claim 10, further comprising a driver circuit, wherein the driver circuit comprises a plurality of circuit transistors, wherein each of the plurality of circuit transistors comprises a channel formation region in a semiconductor substrate, wherein the insulating layer, the plurality of transistors, and the plurality of light-emitting diodes are between the substrate and the semiconductor substrate, and wherein the plurality of transistors is closer to the substrate than the plurality of circuit transistors is.

15. The display device according to claim 10, further comprising a functional layer, wherein the functional layer is between the substrate and the one of the plurality of light-emitting diodes, wherein the one of the plurality of light-emitting diodes emits light toward the substrate through the functional layer, and wherein the functional layer comprises one or both of a coloring layer and a color conversion layer.

16. The display device according to claim 10, further comprising a touch sensor, wherein each of the plurality of light-emitting diodes is configured to emit light toward the touch sensor through the substrate.

17. A display module comprising:

the display device according to claim 10; and one of a connector and an integrated circuit electrically connected to the display device.

18. The display device according to claim 10, further comprising a color conversion layer overlapping with the one of the plurality of light-emitting diodes, wherein the color conversion layer includes a quantum dot.

* * * * *